(12) United States Patent
Wiser et al.

(10) Patent No.: US 9,184,698 B1
(45) Date of Patent: Nov. 10, 2015

(54) REFERENCE FREQUENCY FROM AMBIENT LIGHT SIGNAL

(71) Applicant: Google Inc., Mountain View, CA (US)

(72) Inventors: Robert Francis Wiser, Cupertino, CA (US); Daniel James Yeager, Berkeley, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/203,639

(22) Filed: Mar. 11, 2014

(51) Int. Cl.
*G02C 7/04* (2006.01)
*H03B 28/00* (2006.01)
*H03L 7/06* (2006.01)
*H03B 17/00* (2006.01)

(52) U.S. Cl.
CPC *H03B 17/00* (2013.01); *G02C 7/04* (2013.01); *H03B 28/00* (2013.01); *H03L 7/06* (2013.01)

(58) Field of Classification Search
CPC .......... G02B 1/04; G02B 1/041; G02B 1/043; G02C 7/02; G02C 7/04; H03B 28/00; H03L 9/00; H03L 7/00; H03L 7/06
USPC ............... 331/18, 19, 25, 65, 66, 177 R, 187; 351/158, 159.01, 159.02
See application file for complete search history.

(56) References Cited

U.S. PATENT DOCUMENTS

| | | | | |
|---|---|---|---|---|
| 3,175,165 A | * | 3/1965 | Dayhoff | 331/66 |
| 3,334,309 A | * | 8/1967 | Murphy et al. | 331/66 |
| 3,363,193 A | * | 1/1968 | Arnold | 331/3 |
| 3,634,776 A | * | 1/1972 | Bell | 331/25 |
| 3,665,340 A | * | 5/1972 | Kojima et al. | 331/107 R |
| 3,842,257 A | * | 10/1974 | Kohler | 250/214 B |
| 3,958,560 A |   | 5/1976 | March | |

(Continued)

FOREIGN PATENT DOCUMENTS

| | | |
|---|---|---|
| EP | 0369942 | 5/1990 |
| EP | 0686372 | 12/1995 |

(Continued)

OTHER PUBLICATIONS

Bionic contact lens 'To project emails before eyes,' http://www.kurzweilai.netforums/topic/bionic-contact-lens-to-project-emails-before-eyes, Last accessed Mar. 14, 2012, 2 pages.

(Continued)

*Primary Examiner* — Levi Gannon
(74) *Attorney, Agent, or Firm* — McDonnell Boehnen Hulbert & Berghoff LLP

(57) ABSTRACT

A system includes an oscillator referenced to a frequency extracted from periodic intensity modulations of incident light. The incident light can be intensity modulated based on the frequency of the AC voltage that powers artificial lighting. The system includes a light-sensitive element configured to generate an output signal indicative of an intensity of incident light and a controller. The controller can receive a first input signal based on the output signal from the light-sensitive element. In the presence of artificial lighting, the first input signal has a frequency based on a reference frequency at which an intensity of light incident on the light-sensitive element periodically varies. The controller can generate a control signal based in part on the reference frequency. The controller can provide the generated control signal to the adjustable oscillator to thereby adjust the oscillator frequency.

19 Claims, 8 Drawing Sheets

(56) References Cited

U.S. PATENT DOCUMENTS

| | | |
|---|---|---|
| 4,014,321 A | 3/1977 | March |
| 4,055,378 A | 10/1977 | Feneberg et al. |
| 4,122,942 A | 10/1978 | Wolfson |
| 4,136,250 A | 1/1979 | Mueller et al. |
| 4,143,949 A | 3/1979 | Chen |
| 4,153,641 A | 5/1979 | Deichert et al. |
| 4,214,014 A | 7/1980 | Hofer et al. |
| 4,264,875 A * | 4/1981 | Hunsperger et al. ............ 331/66 |
| 4,309,085 A | 1/1982 | Morrison |
| 4,312,575 A | 1/1982 | Peyman et al. |
| 4,401,371 A | 8/1983 | Neefe |
| 4,463,149 A | 7/1984 | Ellis |
| 4,555,372 A | 11/1985 | Kunzler et al. |
| 4,604,479 A | 8/1986 | Ellis |
| 4,632,844 A | 12/1986 | Yanagihara et al. |
| 4,686,267 A | 8/1987 | Ellis et al. |
| 4,740,533 A | 4/1988 | Su et al. |
| 4,826,936 A | 5/1989 | Ellis |
| 4,849,716 A * | 7/1989 | Golio et al. ...................... 331/66 |
| 4,996,275 A | 2/1991 | Ellis et al. |
| 4,997,770 A | 3/1991 | Giles et al. |
| 5,032,658 A | 7/1991 | Baron et al. |
| 5,034,461 A | 7/1991 | Lai et al. |
| 5,070,215 A | 12/1991 | Bambury et al. |
| 5,135,297 A | 8/1992 | Valint et al. |
| 5,177,165 A | 1/1993 | Valint et al. |
| 5,177,168 A | 1/1993 | Baron et al. |
| 5,219,965 A | 6/1993 | Valint et al. |
| 5,260,000 A | 11/1993 | Nandu et al. |
| 5,271,875 A | 12/1993 | Appleton et al. |
| 5,302,918 A * | 4/1994 | Sturzebecher et al. ......... 331/10 |
| 5,310,779 A | 5/1994 | Lai |
| 5,321,108 A | 6/1994 | Kunzler et al. |
| 5,326,584 A | 7/1994 | Kamel et al. |
| 5,336,797 A | 8/1994 | McGee et al. |
| 5,346,976 A | 9/1994 | Ellis et al. |
| 5,358,995 A | 10/1994 | Lai et al. |
| 5,364,918 A | 11/1994 | Valint et al. |
| 5,387,662 A | 2/1995 | Kunzler et al. |
| 5,449,729 A | 9/1995 | Lai |
| 5,472,436 A | 12/1995 | Fremstad |
| 5,512,205 A | 4/1996 | Lai |
| 5,585,871 A | 12/1996 | Linden |
| 5,610,252 A | 3/1997 | Bambury et al. |
| 5,616,757 A | 4/1997 | Bambury et al. |
| 5,682,210 A | 10/1997 | Weirich |
| 5,708,094 A | 1/1998 | Lai et al. |
| 5,710,302 A | 1/1998 | Kunzler et al. |
| 5,714,557 A | 2/1998 | Kunzler et al. |
| 5,726,733 A | 3/1998 | Lai et al. |
| 5,760,100 A | 6/1998 | Nicolson et al. |
| 5,894,247 A * | 4/1999 | Yoshida et al. ................. 331/18 |
| 5,908,906 A | 6/1999 | Kunzler et al. |
| 5,981,669 A | 11/1999 | Valint et al. |
| 6,087,941 A | 7/2000 | Ferraz et al. |
| 6,131,580 A | 10/2000 | Ratner et al. |
| 6,193,369 B1 | 2/2001 | Valint et al. |
| 6,200,626 B1 | 3/2001 | Grobe et al. |
| 6,213,604 B1 | 4/2001 | Valint et al. |
| 6,312,393 B1 | 11/2001 | Abreu |
| 6,348,507 B1 | 2/2002 | Heiler et al. |
| 6,366,794 B1 | 4/2002 | Moussy et al. |
| 6,423,001 B1 | 7/2002 | Abreu |
| 6,428,839 B1 | 8/2002 | Kunzler et al. |
| 6,431,705 B1 | 8/2002 | Linden |
| 6,440,571 B1 | 8/2002 | Valint et al. |
| 6,450,642 B1 | 9/2002 | Jethmalani et al. |
| 6,532,298 B1 | 3/2003 | Cambier et al. |
| 6,550,915 B1 | 4/2003 | Grobe, III |
| 6,570,386 B2 | 5/2003 | Goldstein |
| 6,579,235 B1 | 6/2003 | Abita et al. |
| 6,599,559 B1 | 7/2003 | McGee et al. |
| 6,614,408 B1 | 9/2003 | Mann |
| 6,630,243 B2 | 10/2003 | Valint et al. |
| 6,638,563 B2 | 10/2003 | McGee et al. |
| 6,726,322 B2 | 4/2004 | Andino et al. |
| 6,735,328 B1 | 5/2004 | Helbing et al. |
| 6,779,888 B2 | 8/2004 | Marmo |
| 6,804,560 B2 | 10/2004 | Nisch et al. |
| 6,851,805 B2 | 2/2005 | Blum et al. |
| 6,885,818 B2 | 4/2005 | Goldstein |
| 6,939,299 B1 | 9/2005 | Petersen et al. |
| 6,980,842 B2 | 12/2005 | March et al. |
| 7,018,040 B2 | 3/2006 | Blum et al. |
| 7,131,945 B2 | 11/2006 | Fink et al. |
| 7,169,106 B2 | 1/2007 | Fleischman et al. |
| 7,398,119 B2 | 7/2008 | Lambert et al. |
| 7,423,801 B2 | 9/2008 | Kaufman et al. |
| 7,429,465 B2 | 9/2008 | Muller et al. |
| 7,441,892 B2 | 10/2008 | Hsu |
| 7,443,016 B2 | 10/2008 | Tsai et al. |
| 7,450,981 B2 | 11/2008 | Jeon |
| 7,639,845 B2 | 12/2009 | Utsunomiya |
| 7,654,671 B2 | 2/2010 | Glynn |
| 7,699,465 B2 | 4/2010 | Dootjes et al. |
| 7,728,949 B2 | 6/2010 | Clarke et al. |
| 7,751,896 B2 | 7/2010 | Graf et al. |
| 7,799,243 B2 | 9/2010 | Mather et al. |
| 7,809,417 B2 | 10/2010 | Abreu |
| 7,878,650 B2 | 2/2011 | Fritsch et al. |
| 7,885,698 B2 | 2/2011 | Feldman |
| 7,907,931 B2 | 3/2011 | Hartigan et al. |
| 7,920,663 B1 | 4/2011 | Stevens |
| 7,926,940 B2 | 4/2011 | Blum et al. |
| 7,931,832 B2 | 4/2011 | Pugh et al. |
| 7,964,390 B2 | 6/2011 | Rozakis et al. |
| 8,031,012 B2 * | 10/2011 | Hasegawa ....................... 331/66 |
| 8,031,021 B2 * | 10/2011 | Lee et al. ...................... 331/165 |
| 8,080,187 B2 | 12/2011 | Tepedino, Jr. et al. |
| 8,096,654 B2 | 1/2012 | Amirparviz et al. |
| 8,118,752 B2 | 2/2012 | Hetling et al. |
| 8,142,016 B2 | 3/2012 | Legerton et al. |
| 8,224,415 B2 | 7/2012 | Budiman |
| 2002/0193674 A1 | 12/2002 | Fleischman et al. |
| 2003/0179094 A1 | 9/2003 | Abreu |
| 2004/0027536 A1 | 2/2004 | Blum et al. |
| 2004/0116794 A1 | 6/2004 | Fink et al. |
| 2004/0251976 A1* | 12/2004 | Miyake ........................... 331/66 |
| 2005/0045589 A1 | 3/2005 | Rastogi et al. |
| 2005/0221276 A1 | 10/2005 | Rozakis et al. |
| 2007/0016074 A1 | 1/2007 | Abreu |
| 2007/0030443 A1 | 2/2007 | Chapoy et al. |
| 2007/0121065 A1 | 5/2007 | Cox et al. |
| 2007/0188710 A1 | 8/2007 | Hetling et al. |
| 2008/0208335 A1 | 8/2008 | Blum et al. |
| 2008/0218696 A1 | 9/2008 | Mir |
| 2009/0033863 A1 | 2/2009 | Blum et al. |
| 2009/0036761 A1 | 2/2009 | Abreu |
| 2009/0057164 A1 | 3/2009 | Minick et al. |
| 2009/0076367 A1 | 3/2009 | Sit et al. |
| 2009/0118604 A1 | 5/2009 | Phan et al. |
| 2009/0189830 A1 | 7/2009 | Deering et al. |
| 2009/0196460 A1 | 8/2009 | Jakobs et al. |
| 2010/0001926 A1 | 1/2010 | Amirparviz et al. |
| 2010/0013114 A1 | 1/2010 | Bowers et al. |
| 2010/0016704 A1 | 1/2010 | Naber et al. |
| 2010/0028559 A1 | 2/2010 | Yan et al. |
| 2010/0072643 A1 | 3/2010 | Pugh et al. |
| 2010/0109175 A1 | 5/2010 | Pugh et al. |
| 2010/0110372 A1 | 5/2010 | Pugh et al. |
| 2010/0113901 A1 | 5/2010 | Zhang et al. |
| 2010/0133510 A1 | 6/2010 | Kim et al. |
| 2010/0249548 A1 | 9/2010 | Muller |
| 2011/0015512 A1 | 1/2011 | Pan et al. |
| 2011/0028807 A1 | 2/2011 | Abreu |
| 2011/0040161 A1 | 2/2011 | Abreu |
| 2011/0055317 A1 | 3/2011 | Vonog et al. |
| 2011/0063568 A1 | 3/2011 | Meng et al. |
| 2011/0084834 A1 | 4/2011 | Sabeta |
| 2011/0116035 A1 | 5/2011 | Fritsch et al. |
| 2011/0157541 A1 | 6/2011 | Peyman |
| 2011/0157544 A1 | 6/2011 | Pugh et al. |
| 2011/0184271 A1 | 7/2011 | Veciana et al. |
| 2011/0274680 A1 | 11/2011 | Mazed et al. |

(56) References Cited

U.S. PATENT DOCUMENTS

| | | | |
|---|---|---|---|
| 2011/0286064 | A1 | 11/2011 | Burles et al. |
| 2011/0298794 | A1 | 12/2011 | Freedman |
| 2012/0026458 | A1 | 2/2012 | Qiu et al. |
| 2012/0038881 | A1 | 2/2012 | Amirparviz et al. |
| 2012/0041287 | A1 | 2/2012 | Goodall et al. |
| 2012/0041552 | A1 | 2/2012 | Chuck et al. |
| 2012/0069254 | A1 | 3/2012 | Burton |
| 2012/0075168 | A1 | 3/2012 | Osterhout et al. |
| 2012/0075574 | A1 | 3/2012 | Pugh et al. |
| 2012/0078071 | A1 | 3/2012 | Bohm et al. |
| 2012/0088258 | A1 | 4/2012 | Bishop et al. |
| 2012/0092612 | A1 | 4/2012 | Binder |
| 2012/0109296 | A1 | 5/2012 | Fan |
| 2012/0177576 | A1 | 7/2012 | Hu |
| 2012/0201755 | A1 | 8/2012 | Rozakis et al. |
| 2012/0245444 | A1 | 9/2012 | Otis et al. |
| 2012/0259188 | A1 | 10/2012 | Besling |

FOREIGN PATENT DOCUMENTS

| | | |
|---|---|---|
| EP | 1061874 | 12/2000 |
| EP | 1818008 | 8/2007 |
| EP | 1947501 | 7/2008 |
| EP | 1617757 | 8/2009 |
| EP | 2457122 | 5/2012 |
| WO | 95/04609 | 2/1995 |
| WO | 01/16641 | 3/2001 |
| WO | 01/34312 | 5/2001 |
| WO | 03/065876 | 8/2003 |
| WO | 2004/060431 | 7/2004 |
| WO | 2004/064629 | 8/2004 |
| WO | 2006/015315 | 2/2006 |
| WO | 2009/094643 | 7/2009 |
| WO | 2010/105728 | 9/2010 |
| WO | 2010/133317 | 11/2010 |
| WO | 2011/011344 | 1/2011 |
| WO | 2011/034592 | 3/2011 |
| WO | 2011/035228 | 3/2011 |
| WO | 2011/035262 | 3/2011 |
| WO | 2011/083105 | 7/2011 |
| WO | 2011/163080 | 12/2011 |
| WO | 2012/035429 | 3/2012 |
| WO | 2012/037455 | 3/2012 |
| WO | 2012/051167 | 4/2012 |
| WO | 2012/051223 | 4/2012 |
| WO | 2012052765 | 4/2012 |

OTHER PUBLICATIONS

Brahim, et al., "Polypyrrole-hydrogel composites for the construction of clinically important biosensors," 2002, Biosensors & Bioelectronics, pp. 53-59, vol. 17.

Chen, et al., "Microfabricated Implantable Parylene-Based Wireless Passive Intraocular Pressure Sensors," Journal of Microelectromechanical Systems, Dec. 2008, pp. 1342-1351, vol. 17, No. 6.

Chu, et al., "Soft Contact-lens Sensor for Monitoring Tear Sugar as Novel Wearable Device of Body Sensor Network," http://www.ksi edu/seke/dms11/DMS/2_Kohji_Mitsubayashi.pdf, Last accessed Jul. 27, 2012, 4 pages.

"Contact Lenses: Look Into My Eyes," The Economist, Jun. 2, 2011, http://www.economist.com/node/18750624/print, Last accessed Mar. 13, 2012, 8 pages.

Haders, "New Controlled Release Technologies Broaden Opportunities for Ophthalmic Therapies," Drug Delivery Technology, Jul./Aug. 2009, pp. 48-53, vol. 8, No. 7.

Holloway, "Microsoft developing electronic contact lens to monitor blood sugar," Gizmag, Jan. 5, 2012, http://www.gizmag.com/microsoft-electronic-diabetic-contact-lens/20987/, Last accessed Mar. 13, 2012. 5 pages.

Huang, et al., "Wrinkling of Ultrathin Polymer Films," Mater. Res. Soc. Symp. Proc., 2006, 6 pages, vol. 924, Materials Research Society.

Hurst, "How contact lenses could help save your life," Mail Online, Apr. 19, 2010, http://www.dailymail.co.uk/health/article-1267345/How-contact-lenses-help-save-life.html, Last accessed Jul. 27, 2012.

Liao, et al., "A 3-µW CMOS Glucose Sensor for Wireless Contact-Lens Tear Glucose Monitoring ," IEEE Journal of Solid-State Circuits, Jan. 2012, pp. 335-344, vol. 47, No. 1.

Liao, et al., "A 3-µW Wirelessly Powered CMOS Glucose Sensor for an Active Contact Lens," 2011 IEEE International Solid-State Circuits Conference, Session 2, Feb. 21, 2011, 3 pages.

Lingley, et al., "A Single-Pixel Wireless Contact Lens Display," Journal of Micromechanics and Microengineering, 2011, pp. 1-8.

Lingley, et al., "Multipurpose integrated active contact lenses," SPIE, 2009, 2 pages.

Liu, et al., "Miniature Amperometric Self-Powered Continuous Glucose Sensor with Linear Response," Analytical Chemistry, 2012, 7 pages.

Loncar, et al., "Design and Fabrication of Silicon Photonic Crystal Optical Waveguides," Journal of Lightwave Technology, Oct. 2000, pp. 1402-1411, vol. 18, No. 10.

Murdan, "Electro-responsive drug delivery from hydrogels," Journal of Controlled Release, 2003, pp. 1-17, vol. 92.

Pandey, et al., "A Fully Integrated RF-Powered Contact Lens With a Single Element Display," IEEE Transactions on Biomedical Circuits and Systems, Dec. 2010, pp. 454-461, vol. 4, No. 6.

Parviz, Babak A., "Augmented Reality in a Contact Lens," IEEE Spectrum, Sep. 2009, http://spectrum.ieee.org/biomedical/bionics/augmented-reality-in-a-contact-lens/0, Last accessed Mar. 14, 2012, 6 pages.

Selner, et al., "Novel Contact Lens Electrode Array for Multi-electrode Electroretinography (meERG)," IEEE, 2011, 2 pages.

Singh, et al., "Novel Approaches in Formulation and Drug Delivery using Contact Lenses," Journal of Basic and Clinical Pharmacy, May 2011, pp. 87-101, vol. 2, Issue 2.

Thomas, et al., "Functional Contact Lenses for Remote Health Monitoring in Developing Countries," IEEE Global Humanitarian Technology Conference, 2011, pp. 212-217, IEEE Computer Society.

Tweedie, et al., "Contact creep compliance of viscoelastic materials via nanoindentation," J. Mater. Res., Jun. 2006, pp. 1576-1589, vol. 21, No. 2, Materials Research Society.

Wall, K., "Active contact lens that lets you see like the Terminator patented," Feb. 10, 2012, http://vvww.patexia.com/feed/active-contact-lens-that-lets-you-see-like-the-terminator-patented-2407, Last accessed Mar. 28, 2012, 5 pages.

Zarbin, et al., "Nanotechnology in ophthalmology," Can J Ophthalmol, 2010, pp. 457-476, vol. 45, No. 5.

Badugu et al., "A Glucose Sensing Contact Lens: A Non-Invasive Technique for Continuous Physiological Glucose Monitoring," Journal of Fluorescence, Sep. 2003, pp. 371-374, vol. 13, No. 5.

Carlson et al., "A 20 mV Input Boost Converter With Efficient Digital Control for Thermoelectric Energy Harvesting," IEEE Journal of Solid-State Circuits, Apr. 2010, pp. 741-750, vol. 45, No. 4.

Chu et al., "Biomedical soft contact-lens sensor for in situ ocular biomonitoring of tear contents," Biomed Microdevices, 2011, pp. 603-611, vol. 13.

Chu et al., "Soft contact lens biosensor for in situ monitoring of tear glucose as non-invasive blood sugar assessment," Talanta, 2011, pp. 960-965, vol. 83.

Ho et al., "Contact Lens With Integrated Inorganic Semiconductor Devices," MEMS 2008. IEEE 21st International Conference on. IEEE, 2008., pp. 403-406.

Lähdesmäki et al., "Possibilities for Continuous Glucose Monitoring by a Functional Contact Lens," IEEE Instrumentation & Measurement Magazine, Jun. 2010, pp. 14-17.

Lingley et al., "A contact lens with integrated micro solar cells," Microsyst Technol, 2012, pp. 453-458, vol. 18.

Parviz, Babak A., "For Your Eyes Only," IEEE Spectrum, Sep. 2009, pp. 36-41.

Saeedi, E. et al., "Self-assembled crystalline semiconductor optoelectronics on glass and plastic," J. Micromech. Microeng., 2008, pp. 1-7, vol. 18.

Saeedi et al., "Self-Assembled Inorganic Micro-Display on Plastic," Micro Electro Mechanical Systems, 2007. MEMS. IEEE 20th International Conference on. IEEE, 2007., pp. 755-758.

(56) References Cited

OTHER PUBLICATIONS

Sensimed Triggerfish, Sensimed Brochure, 2010, 10 pages.

Shih, Yi-Chun et al., "An Inductorless DC-DC Converter for Energy Harvesting With a 1.2-µW Bandgap-Referenced Output Controller," IEEE Transactions on Circuits and Systems—II: Express Briefs, Dec. 2011, pp. 832-836, vol. 58, No. 12.

Shum et al., "Functional modular contact lens," Proc. of SPIE, 2009, pp. 73970K-1 to 73970K-8, vol. 7397.

Stauth et al., "Self-assembled single-crystal silicon circuits on plastic," PNAS, Sep. 19, 2006, pp. 13922-13927, vol. 103, No. 38.

Yao, H. et al., "A contact lens with integrated telecommunication circuit and sensors for wireless and continuous tear glucose monitoring," J. Micromech. Microeng., 2012, pp. 1-10, vol. 22.

Yao, H. et al., "A Dual Microscal Glucose Sensor on a Contact Lens, Tested in Conditions Mimicking the Eye," Micro Electro Mechanical Systems (MEMS), 2011 IEEE 24th International Conference on. IEEE, 2011, pp. 25-28.

Yao et al., "A contact lens with embedded sensor for monitoring tear glucose level," Biosensors and Bioelectronics, 2011, pp. 3290-3296, vol. 26.

Yao, H. et al., "A Soft Hydrogel Contact Lens with an Encapsulated Sensor for Tear Glucose Monitoring," Micro Electro Mechanical Systems (MEMS), 2012 IEEE 25th International Conference on. IEEE, 2012, pp. 769-772.

Yeager et al., "A 9 µA, Addressable Gent Sensor Tag for Biosignal Acquistion," IEEE Journal of Solid-State Circuits, Oct. 2010, pp. 2198-2209, vol. 45, No. 10.

Zhang et al., "Design for Ultra-Low Power Biopotential Amplifiers for Biosignal Acquistion Applications," IEEE Transactions on Biomedical Circuits and Systems, 2012, pp. 344-355, vol. 6, No. 4.

\* cited by examiner

REFERENCE FREQUENCY FROM AMBIENT LIGHT SIGNAL

BACKGROUND

Unless otherwise indicated herein, the materials described in this section are not prior art to the claims in this application and are not admitted to be prior art by inclusion in this section.

Artificial fluorescent or incandescent lighting is typically modulated by the mains frequency of the alternating current (AC) electrical power from the grid. Thus, in the US, lighting is typically modulated at 120 Hertz (due to 60 Hertz utility waveform reaching maximum voltage difference twice per cycle), and in Europe, lighting is typically modulated at 100 Hertz (due to the 50 Hertz utility waveform).

In conventional electronics systems, individual electrical components may vary due to variations in the fabrication process. For instance, integrated circuit components may have different values due to variations in the die process that forms the chip. Such process variations can be accounted for, in practice, using at least two precision components, which can be used as references to calibrate the remaining components. One precision value can be provided from the bandgap voltage of silicon. Another precision value may be provided using an off-chip precision resistor that has been separately calibrated. Using the combination of the silicon bandgap voltage and the precision resistor value as references, the remaining components on the chip can then be characterized and calibrated for. In other examples, instead of a precision resistor, a precision timing reference may be provided by a quartz oscillator or another precision component connected to the chip. The precision timing reference can then be used in combination with the silicon bandgap voltage to calibrate other components.

SUMMARY

A system includes an oscillator referenced to a frequency extracted from periodic intensity modulations of incident light. The incident light can be intensity modulated based on the frequency of the AC voltage that powers artificial lighting. The system includes a light-sensitive element configured to generate an output signal indicative of an intensity of incident light and a controller. The controller can receive a first input signal based on the output signal from the light-sensitive element. In the presence of artificial lighting, the first input signal has a frequency based on a reference frequency at which an intensity of light incident on the light-sensitive element periodically varies. The controller can generate a control signal based in part on the reference frequency. The controller can provide the generated control signal to the adjustable oscillator to thereby adjust the oscillator frequency.

Some embodiments of the present disclosure provide a system including an adjustable oscillator, a light-sensitive element, and a controller. The adjustable oscillator can be configured to generate a periodically varying output signal at an oscillator frequency. The oscillator frequency can be at least partially based on an input control signal. The light-sensitive element can be configured to generate an output signal indicative of an intensity of light incident on the light-sensitive element. The controller can be configured to receive a first input signal based on the output signal from the light-sensitive element. The first input signal can have a frequency based on a reference frequency at which an intensity of light incident on the light-sensitive element periodically varies. The controller can be configured to generate a control signal based in part on the reference frequency; and provide the generated control signal to the adjustable oscillator to thereby adjust the oscillator frequency.

Some embodiments of the present disclosure provide a method. The method can include receiving a first input signal based on an output signal from a light-sensitive element. The first input signal can have a frequency based on a reference frequency at which an intensity of light incident on the light-sensitive element periodically varies. The method can include generating a control signal based in part on the reference frequency. The method can include providing the generated control signal to an adjustable oscillator to thereby adjust an oscillator frequency thereof.

Some embodiments of the present disclosure provide a body-mountable device including a polymeric material, a substrate, an adjustable oscillator, a light-sensitive element, and a controller. The polymeric material can be formed to include a body-mountable surface. The substrate can be at least partially embedded within the polymeric material. The adjustable oscillator can be disposed on the substrate. The adjustable oscillator can be configured to generate a periodically varying output signal at an oscillator frequency. The oscillator frequency can be at least partially based on an input control signal. The light-sensitive element can be disposed on the substrate. The light-sensitive element can be configured to generate an output signal indicative of an intensity of light incident on the light-sensitive element. The controller can be disposed on the substrate. The controller can be configured to receive a first input signal including a signal generated based on the output signal from the light-sensitive element. The first input signal can have a frequency based on a reference frequency at which an intensity of light incident on the light-sensitive element periodically varies. The controller can be configured to generate a control signal based in part on the reference frequency; and provide the generated control signal to the adjustable oscillator to thereby adjust the oscillator frequency.

Some embodiments of the present disclosure provide means for receiving a first input signal based on an output signal from a light-sensitive element. The first input signal can have a frequency based on a reference frequency at which an intensity of light incident on the light-sensitive element periodically varies. Some embodiments of the present disclosure provide means for generating a control signal based in part on the reference frequency. Some embodiments of the present disclosure provide means for providing the generated control signal to an adjustable oscillator to thereby adjust an oscillator frequency thereof.

These as well as other aspects, advantages, and alternatives, will become apparent to those of ordinary skill in the art by reading the following detailed description, with reference where appropriate to the accompanying drawings.

DETAILED DESCRIPTION

Figure 1:
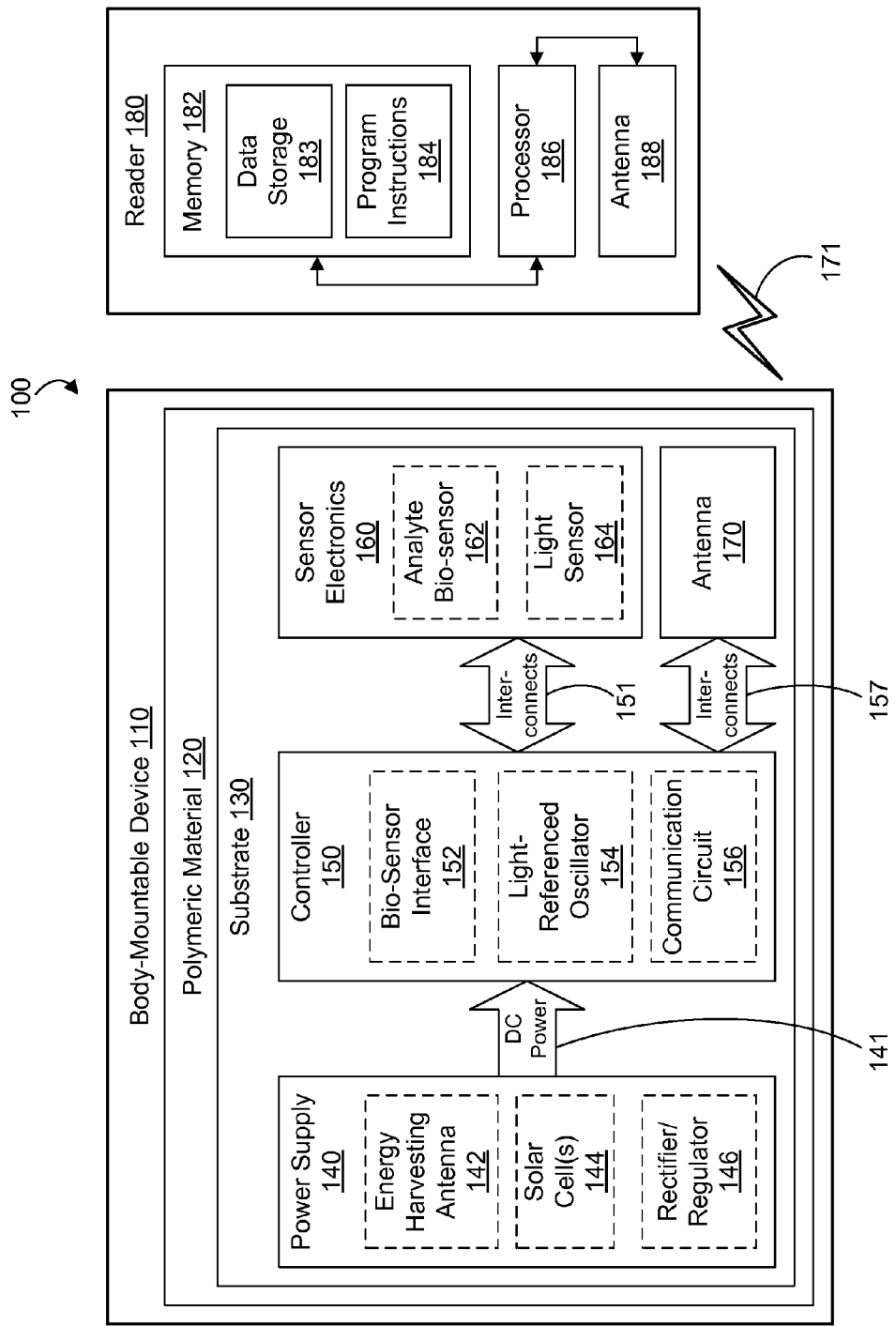
FIG. 1 is a block diagram of an example system that includes a body-mountable device in wireless communication with an external reader.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

I. Overview

An oscillator is referenced to an AC mains frequency using light from an artificial light source. The artificial light source emits light having a periodically varying intensity due to the AC voltage that powers the lighting. Over the course of a cycle of the AC waveform, the intensity of the emitted light reaches a maximum when the magnitude of the AC voltage is maximized and the intensity reaches a minimum when the magnitude of the AC voltage is minimized. In a single cycle of a sinusoidal AC waveform, the AC waveform has two zero crossings (one positive-headed zero-crossing and one negative-headed zero-crossing) and also two magnitude maximums (one at maximum positive voltage and one at minimum negative voltage). The intensity of the emitted light is therefore modulated at a frequency that is approximately twice the mains frequency. Thus, artificial lighting has an intensity that varies with a frequency of about 100 Hertz (for a 50 Hertz utility line frequency) or about 120 Hertz (for a 60 Hertz utility line frequency).

A system is disclosed herein that uses the periodically varying light intensity from an artificial light source to calibrate an oscillator frequency. The system includes a detection circuit with a light-sensitive element, such as a photodiode, that responds to incident light and provides an output signal indicating the intensity of incident light. A comparator can then generate a series of pulses at the frequency of the intensity modulation (i.e., twice the mains frequency) by generating a pulse each time the incident light exceeds a threshold, and that series of pulses can be used to tune the frequency of the oscillator. For example, the series of pulses can be used as an input to a frequency locked loop, in which a controller adjusts an input to the adjustable oscillator such that the oscillator frequency approaches a target multiple of the frequency of intensity modulations over time.

To extract the frequency of the artificial lighting, the system includes a light-sensitive element, an adjustable oscillator, and a controller that adjusts the frequency of the oscillator based on an output from the light-sensitive element. The light-sensitive element can be a photodiode that provide a photocurrent current related to the intensity of incident light. A transimpedance amplifier can convert the photocurrent to a voltage, and the voltage can be supplied to a comparator. The comparator can compare the voltage from the transimpedance amplifier and identify instances when the voltage exceeds a threshold, which instances can correspond to relative maxima in the intensity modulated light received at the photodiode. The comparator can output pulses for each maxima of the received light intensity. The frequency of the pulses correspond to the frequency of the intensity modulation (i.e., twice the mains frequency). The pulses from the comparator can then be used as a reference to adjust the frequency of the adjustable oscillator.

The adjustable oscillator may be a voltage controlled oscillator (VCO), and a controller or other feedback system can generate an input to the VCO that adjusts the oscillator frequency. For example, the controller can generate the input to the VCO based in part on the comparator pulses so as to cause the VCO frequency to achieve a target multiple of the frequency of the comparator pulses. The controller may include one or more counters or other logic that count the number of pulses output from the VCO between successive pulses of the comparator. The number of pulses from the VCO can then be compared to a target number of pulses, and the input to the VCO can be increased or decreased based on the comparison to tune the oscillator frequency to approach a target multiple of the frequency of the intensity modulated light.

In one example, the VCO target frequency may be about 1.8 MHz. A target frequency of 1.8 MHz corresponds to a target number between each successive comparator pulse of about 15,000 (e.g., 1.8 MHz/120 Hz=15,000). For ambient light that is intensity modulated at a frequency of 120 Hz (twice a 60 Hz AC mains line), the frequency locked loop can tune the input to the VCO until the counter reaches 15,000 counts for each pulse from the comparator. If the counter counts less than the target number, then the VCO is outputting a signal with a lower frequency than the target value, and so the input can be adjusted to increase the frequency of the VCO. If the counter counts more than the target number, then the VCO is outputting a signal with a greater frequency than the target value, and so the input can be adjusted to decrease the frequency of the VCO.

The frequency locked loop may include a digital to analog converter for supplying the input to the VCO, and may also optionally include non-volatile memory that stores an indication of a most-recently supplied input. The stored indication can then be used in instances when the system is not receiving intensity modulated light, such as when the device is outdoors, in a dark environment, or otherwise not in an environment illuminated by intensity modulated artificial lighting. In some instances, the non-volatile memory may also store more than one input, and vary the input to the VCO based on other detected parameters known to alter the behavior of the VCO, such as temperature.

Having such a calibrated oscillator may be useful in a variety of applications. In some instances, the calibrated oscillator may be used as a timing reference to calibrate and/or compensate for process variations in other circuit components. In spatially constrained and/or power constrained applications, such as encountered in the context of body-mountable electronic devices, including an off chip precision timing reference or a precision resistor to use as a calibration reference may be impractical due to the spatial and/or power constraints. As noted above, accounting for process variations in the circuit components of an integrated circuit can involve the use of two precision references, from which other components can be calibrated. By calibrating an adjustable oscillator using the intensity modulation of an artificial light source, a precision timing reference can be obtained without including a quartz oscillator or other off-chip precision component.

One such body-mountable electronic device may be an eye-mountable device formed of a polymeric material that is shaped to be contact mounted to an eye, similar to a contact lens. A substrate embedded within the polymeric material can be used to mount bio-interactive electronics and associated power and communication electronics. In one example, an antenna disposed on the substrate is used to harvest energy from incident radio frequency radiation, and the harvested energy can be used, via a rectifier and voltage regulator, to power the remaining electronics. Communication electronics can be used to modulate the impedance of the energy-harvesting antenna to cause corresponding modifications of the antenna's backscatter radiation, which can then be detected by a reader.

II. Example Body-Mountable Electronics Platform

FIG. 1 is a block diagram of a system 100 that includes a body-mountable device 110 in wireless communication with an external reader 180. The exposed regions of the body-mountable device 110 are made of a polymeric material 120 formed to be contact-mounted to a corneal surface of an eye. A substrate 130 is embedded in the polymeric material 120 to provide a mounting surface for a power supply 140, a controller 150, sensor electronics 160, and a communication antenna 170. The sensor electronics 160 are operated by the controller 150. The power supply 140 supplies operating voltages to the controller 150 and/or the sensor electronics 160. The antenna 170 is operated by the controller 150 to communicate information to and/or from the body-mountable device 110. The antenna 170, the controller 150, the power supply 140, and the sensor electronics 160 can all be situated on the embedded substrate 130. Because the body-mountable device 110 includes electronics and is configured to be contact-mounted to an eye, it is also referred to herein as an ophthalmic electronics platform.

To facilitate contact-mounting, the polymeric material 120 can have a concave surface configured to adhere ("mount") to a moistened corneal surface (e.g., by capillary forces with a tear film coating the corneal surface). Additionally or alternatively, the device 110 can be adhered by a vacuum force between the corneal surface and the polymeric material 120 due to the concave curvature. While mounted with the concave surface against the eye, the outward-facing surface of the polymeric material 120 can have a convex curvature that is formed to not interfere with eye-lid motion while the body-mountable device 110 is mounted to the eye. For example, the polymeric material 120 can be a substantially transparent curved polymeric disk shaped similarly to a vision correction contact lens.

The polymeric material 120 can include one or more bio-compatible materials, such as those employed for use in contact lenses or other ophthalmic applications involving direct contact with the corneal surface. The polymeric material 120 can optionally be formed in part from such biocompatible materials or can include an outer coating with such biocompatible materials. The polymeric material 120 can include materials configured to moisturize the corneal surface, such as hydrogels and the like. In some embodiments, the polymeric material 120 can be a deformable ("non-rigid") material to enhance wearer comfort. In some embodiments, the polymeric material 120 can be shaped to provide a predetermined, vision-correcting optical power, such as can be provided by a contact lens. Moreover, the polymeric material 120 may be formed to facilitate mounting to another body surface, such as a tooth surface, ear surface, skin surface, etc., and the polymeric material 120 may have properties (e.g., flexibility, surface hardness, lubricity, etc.) selected to be suitable for such mounting locations.

The substrate 130 includes one or more surfaces suitable for mounting the sensor electronics 160, the controller 150, the power supply 140, and the antenna 170. The substrate 130 can be employed both as a mounting platform for chip-based circuitry (e.g., by flip-chip mounting to connection pads) and/or as a platform for patterning conductive materials (e.g., gold, platinum, palladium, titanium, copper, aluminum, silver, metals, other conductive materials, combinations of these, etc.) to create electrodes, interconnects, connection pads, antennae, etc. In some embodiments, substantially transparent conductive materials (e.g., indium tin oxide) can be patterned on the substrate 130 to form circuitry, electrodes, etc. For example, the antenna 170 can be formed by forming a pattern of gold or another conductive material on the substrate 130 by deposition, photolithography, electroplating, etc. Similarly, interconnects 151, 157 between the controller 150 and the sensor electronics 160, and between the controller 150 and the antenna 170, respectively, can be formed by depositing suitable patterns of conductive materials on the substrate 130. A combination of microfabrication techniques including, without limitation, the use of photoresists, masks, deposition techniques, and/or plating techniques can be employed to pattern materials on the substrate 130.

The substrate 130 can be a relatively rigid material, such as polyethylene terephthalate ("PET"), parylene, or another material configured to structurally support the circuitry and/or chip-based electronics within the polymeric material 120. The body-mountable device 110 can alternatively be arranged with a group of unconnected substrates rather than a single substrate. For example, the controller 150 and a sensor in sensor electronics 160 can be mounted to one substrate, while the antenna 170 is mounted to another substrate and the two can be electrically connected via the interconnects 157. In another example, the substrate 130 can include separate partitions that each support separated, overlapped coiled portions of the antenna 170. Such as, for example, an example in which the antenna 170 is divided into multiple windings that wrap around the body-mountable device 110 circumferentially at respective radii, and are connected in parallel and/or in series. To facilitate movement of the individual windings with respect to one another, and thereby enhance flexibility of the body-mountable device 110, and help prevent binding, etc., the individual windings may each be mounted on divided portions of the substrate 130, which may substantially correspond to the windings of such an antenna.

The substrate 130 has a width sufficient to provide a mounting platform for the embedded electronics components. The substrate 130 can have a thickness sufficiently small to allow the substrate 130 to be embedded in the polymeric material 120 without influencing the profile of the body-mountable device 110. The substrate 130 can have a thickness sufficiently large to provide structural stability suitable for supporting the electronics mounted thereon. For example, in an implementation in which the body-mountable device 110 is an eye-mountable device, the substrate 130 can be shaped as a ring with a diameter of about 10 millimeters, a radial width of about 1 millimeter (e.g., an outer radius 1 millimeter larger than an inner radius), and a thickness of about 50 micrometers. The substrate 130 can optionally be aligned with the curvature of an eye-mountable surface of the polymeric material 120 (e.g., the convex or concave surfaces). For example, the substrate 130 can be shaped along the surface of an imaginary cone between two circular segments that define an inner radius and an outer radius. In such an example, the surface of the substrate 130 along the surface of the imaginary cone defines an inclined surface that is approximately aligned with the curvature of the eye mounting surface (concave) and/or outward surface (convex) at that radius.

The power supply 140 is configured to harvest ambient energy to power the controller 150 and sensor electronics 160. For example, a radio-frequency energy-harvesting antenna 142 can capture energy from incident radio radiation. Additionally or alternatively, solar cell(s) 144 ("photovoltaic cells") can capture energy from incoming ultraviolet, visible, and/or infrared radiation. Furthermore, an inertial power scavenging system can be included to capture energy from ambient vibrations. The energy harvesting antenna 142 can optionally be a dual-purpose antenna that is also used to communicate information to the external reader 180. That is, the functions of the communication antenna 170 and the energy harvesting antenna 142 can be accomplished with the same physical antenna.

A rectifier/regulator 146 can be used to condition the captured energy to a stable DC supply voltage 141 that is supplied to the controller 150. For example, the energy harvesting antenna 142 can receive incident radio frequency radiation. Varying electrical signals on the leads of the antenna 142 are output to the rectifier/regulator 146. The rectifier/regulator 146 rectifies the varying electrical signals to a DC voltage and regulates the rectified DC voltage to a level suitable for operating the controller 150. Additionally or alternatively, output voltage from the solar cell(s) 144 can be regulated to a level suitable for operating the controller 150. The rectifier/regulator 146 can include one or more energy storage devices to mitigate high frequency variations in the ambient energy gathering antenna 142 and/or solar cell(s) 144. For example, one or more energy storage devices (e.g., a capacitor, a battery, etc.) can be connected in parallel across the outputs of the rectifier 146 to regulate the DC supply voltage 141 and configured to function as a low-pass filter.

The controller 150 can be turned on when the DC supply voltage 141 is provided to the controller 150, and the logic in the controller 150 can then operate the sensor electronics 160 and the antenna 170. The controller 150 can include logic circuitry configured to operate the sensor electronics 160 so as to sense a characteristic of the environment of the body-mountable device 110. For example, the sensor electronics 160 may include an analyte bio-sensor 162 configured to sense an analyte in the biological environment (e.g., tear film) of the body-mountable device 110. Additionally or alternatively, the sensor electronics 160 could include a light sensor 164 that is configured to detect an intensity of incident light, or perhaps an image sensor configured to capture an image from a perspective of the body-mountable device 110 (e.g., an external environment outside of the eye or an internal environment within the eye).

In one example, the controller 150 includes a bio-sensor interface module 152 that is configured to operate analyte bio-sensor 162. The analyte bio-sensor 162 can be, for example, an amperometric electrochemical sensor that includes a working electrode and a reference electrode. A voltage can be applied between the working and reference electrodes to cause an analyte to undergo an electrochemical reaction (e.g., a reduction and/or oxidation reaction) at the working electrode. The electrochemical reaction can generate an amperometric current that can be measured through the working electrode. The amperometric current can be dependent on the analyte concentration. Thus, the amount of the amperometric current that is measured through the working electrode can provide an indication of analyte concentration. In some embodiments, the bio-sensor interface module 152 can be a potentiostat configured to apply a voltage difference between working and reference electrodes while measuring a current through the working electrode.

The controller 150 can include a light-referenced oscillator 154 that is calibrated based on an input from light sensor 164. The light sensor 164 can include one or more photo-sensitive devices, such as a photodiode. In some examples, the light sensor 164 is a circuit including a photodiode that generates a photocurrent that is proportionate to the intensity of incident light. In an artificial lighting environment, the intensity is periodically modulated based on a frequency of the AC mains that powers the artificial lighting. The signal generated by the light sensor 164 in response to incident light includes an indication of the periodic intensity modulation. The output from the light-sensor 164 can therefore be used to adjust the frequency of the oscillator 154 and thereby calibrate the frequency of the oscillator using the AC mains frequency. The light-referenced oscillator may include an adjustable oscillator, such as a voltage controlled oscillator. A controller or other feedback loop can use an input signal from the light sensor 164 (which indicates the frequency of intensity modulated light) and adjust the frequency of the oscillator 154 based in part on that input signal.

Once calibrated, the light-referenced oscillator 154 can then be used as a timing reference to calibrate other components in the controller 150. Among other applications, the controller 150 may include an integrated circuit formed by a die process, and various components in the integrated circuit may have electrical properties that deviate from ideal or intended values due to random variations in the die process. Using the timing reference of the calibrated light-referenced oscillator 154, and also the bandgap voltage of silicon, the process variations can be accounted for. In some cases, the two precision references (e.g., light-referenced oscillator and silicon bandgap voltage) can be used to calibrate and/or compensate for additional components included in the controller 150.

The controller 150 can also include a communication circuit 156 for sending and/or receiving information via the antenna 170. The communication circuit 156 can optionally include one or more oscillators, mixers, frequency injectors, etc. to modulate and/or demodulate information on a carrier frequency to be transmitted and/or received by the antenna 170. In some examples, the body-mountable device 110 is configured to indicate an output from a bio-sensor, light sensor, and/or image sensor by modulating an impedance of the antenna 170 in a manner that can be perceived by the external reader 180. For example, the communication circuit 156 can cause variations in the amplitude, phase, and/or frequency of backscatter radiation from the antenna 170, and such variations can be detected by the reader 180.

The controller 150 is connected to the sensor electronics 160 via interconnects 151. For example, where the controller 150 includes logic elements implemented in an integrated circuit to form the bio-sensor interface module 152 and/or light sensor interface 154, a patterned conductive material (e.g., gold, platinum, palladium, titanium, copper, aluminum, silver, metals, combinations of these, etc.) can connect a terminal on the chip to the sensor electronics 160. Similarly, the controller 150 is connected to the antenna 170 via interconnects 157.

It is noted that the block diagram shown in FIG. 1 is described in connection with functional modules for convenience in description. However, embodiments of the body-mountable device 110 can be arranged with one or more of the functional modules ("sub-systems") implemented in a single chip, integrated circuit, and/or physical component. For example, while the rectifier/regulator 146 is illustrated in the power supply block 140, the rectifier/regulator 146 can be implemented in a chip that also includes the logic elements of the controller 150 and/or other features of the embedded electronics in the body-mountable device 110. Thus, the DC supply voltage 141 that is provided to the controller 150 from the power supply 140 can be a supply voltage that is provided to components on a chip by rectifier and/or regulator components located on the same chip. That is, the functional blocks in FIG. 1 shown as the power supply block 140 and controller block 150 need not be implemented as physically separated modules. Moreover, one or more of the functional modules described in FIG. 1 can be implemented by separately packaged chips electrically connected to one another.

Additionally or alternatively, the energy harvesting antenna 142 and the communication antenna 170 can be implemented with the same physical antenna. For example, a loop antenna can both harvest incident radiation for power generation and communicate information via backscatter radiation.

The external reader 180 includes an antenna 188 (or a group of multiple antennas) to send and receive wireless signals 171 to and from the body-mountable device 110. The external reader 180 also includes a computing system with a processor 186 in communication with a memory 182. The memory 182 is a non-transitory computer-readable medium that can include, without limitation, magnetic disks, optical disks, organic memory, and/or any other volatile (e.g., RAM) or non-volatile (e.g., ROM) storage system readable by the processor 186. The memory 182 can include a data storage 183 to store indications of data, such as sensor readings (e.g., from the analyte bio-sensor 162 and/or light sensor 164), program settings (e.g., to adjust behavior of the body-mountable device 110 and/or external reader 180), etc. The memory 182 can also include program instructions 184 for execution by the processor 186 to cause the external reader 180 to perform processes specified by the instructions 184. For example, the program instructions 184 can cause external reader 180 to communicate with the body-mountable device 110. The program instructions 184 can also cause the external reader 180 to provide a user interface that allows for retrieving information communicated from the body-mountable device 110 (e.g., sensor outputs from the analyte bio-sensor 162 and/or light sensor 164). The external reader 180 can also include one or more hardware components for operating the antenna 188 to send and receive the wireless signals 171 to and from the body-mountable device 110. For example, oscillators, frequency injectors, encoders, decoders, amplifiers, filters, etc. can drive the antenna 188.

The external reader 180 can be a smart phone, digital assistant, or other portable computing device with wireless connectivity sufficient to provide the wireless communication link 171. The external reader 180 can also be implemented as an antenna module that can be plugged in to a portable computing device, such as in an example where the communication link 171 operates at carrier frequencies not commonly employed in portable computing devices. In some instances, the external reader 180 is a special-purpose device configured to be worn relatively near a wearer's eye to allow the wireless communication link 171 to operate with a low power budget. For example, the external reader 180 can be integrated in a piece of jewelry such as a necklace, earing, etc.

or integrated in an article of clothing or an accessory worn near the head, such as a hat, headband, a scarf, a pair of eyeglasses, etc.

In some embodiments, the system 100 can operate to non-continuously ("intermittently") supply energy to the body-mountable device 110 to power the controller 150 and sensor electronics 160. For example, radio frequency radiation 171 can be supplied to power the body-mountable device 110 long enough to operate the sensor electronics 160 and communicate an outcome of such operation. In such an example, the supplied radio frequency radiation 171 can be considered an interrogation signal from the external reader 180 to the body-mountable device 110 to request feedback (e.g., a sensor measurement). By periodically interrogating the body-mountable device 110 (e.g., by supplying radio frequency radiation 171 to temporarily turn the device on), the external reader 180 can accumulate a set of measurements (or other feedback) over time from the sensor electronics 160 without continuously powering the body-mountable device 110.

Figure 2A:
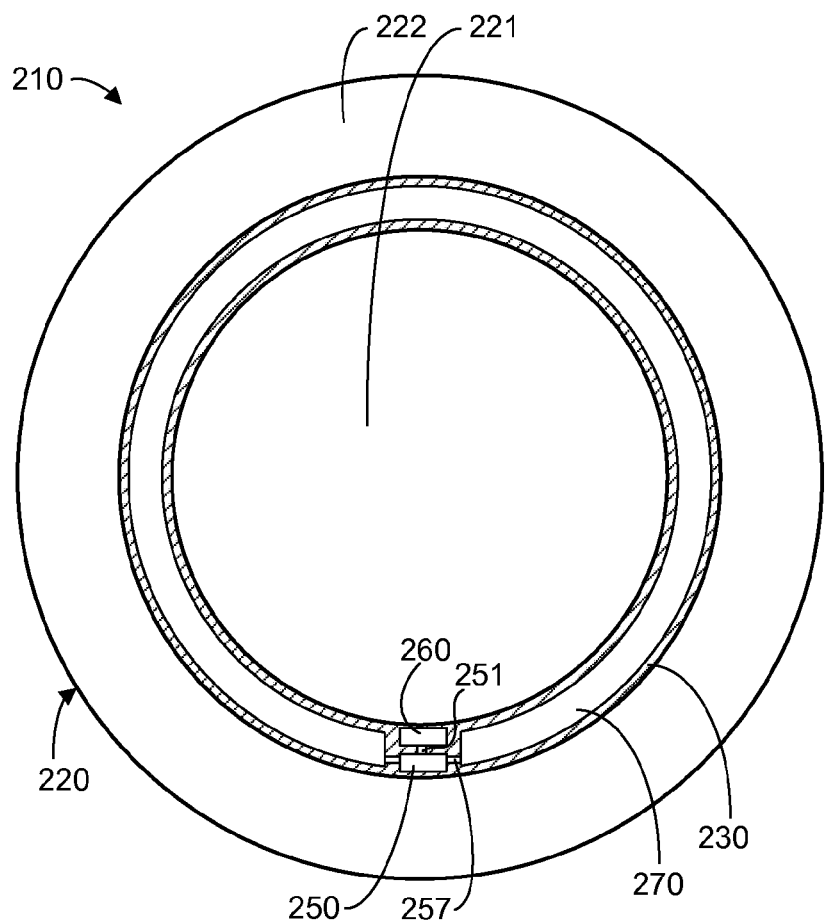
FIG. 2A is a top view of an example eye-mountable device.
Figure 2B:
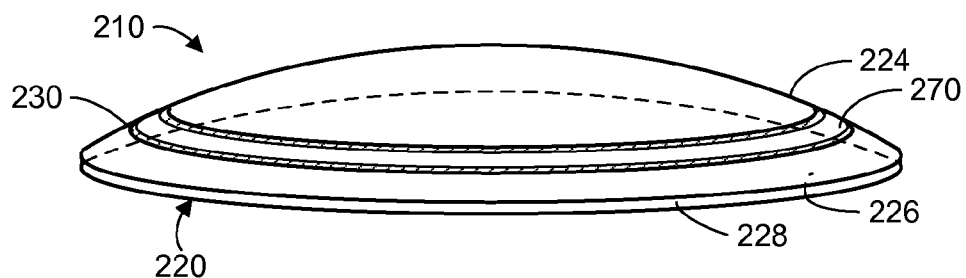
FIG. 2B is a side view of the example eye-mountable device shown in FIG. 2A.

FIG. 2A is a top view of an example eye-mountable electronic device 210 (or ophthalmic electronics platform). FIG. 2B is an aspect view of the example eye-mountable electronic device shown in FIG. 2A. It is noted that relative dimensions in FIGS. 2A and 2B are not necessarily to scale, but have been rendered for purposes of explanation only in describing the arrangement of the example eye-mountable electronic device 210. The eye-mountable device 210 is formed of a polymeric material 220 shaped as a curved disk. The polymeric material 220 can be a substantially transparent material to allow incident light to be transmitted to the eye while the eye-mountable device 210 is mounted to the eye. The polymeric material 220 can be a biocompatible material similar to those employed to form vision correction and/or cosmetic contact lenses in optometry, such as polyethylene terephthalate ("PET"), polymethyl methacrylate ("PMMA"), polyhydroxyethylmethacrylate ("polyHEMA"), silicone hydrogels, combinations of these, etc. The polymeric material 220 can be formed with one side having a concave surface 226 suitable to fit over a corneal surface of an eye. The opposite side of the disk can have a convex surface 224 that does not interfere with eyelid motion while the eye-mountable device 210 is mounted to the eye. A circular outer side edge 228 connects the concave surface 224 and convex surface 226.

The eye-mountable device 210 can have dimensions similar to a vision correction and/or cosmetic contact lenses, such as a diameter of approximately 1 centimeter, and a thickness of about 0.1 to about 0.5 millimeters. However, the diameter and thickness values are provided for example purposes only. In some embodiments, the dimensions of the eye-mountable device 210 can be selected according to the size and/or shape of the corneal surface of the wearer's eye and/or to accommodate one or more components embedded in the polymeric material 220.

The polymeric material 220 can be formed with a curved shape in a variety of ways. For example, techniques similar to those employed to form vision-correction contact lenses, such as heat molding, injection molding, spin casting, etc. can be employed to form the polymeric material 220. While the eye-mountable device 210 is mounted in an eye, the convex surface 224 faces outward to the ambient environment while the concave surface 226 faces inward, toward the corneal surface. The convex surface 224 can therefore be considered an outer, top surface of the eye-mountable device 210 whereas the concave surface 226 can be considered an inner, bottom surface. The "top" view shown in FIG. 2A is facing the convex surface 224 From the top view shown in FIG. 2A, the outer periphery 222, near the outer circumference of the curved disk is curved to extend into the page, whereas the central region 221, near the center of the disk is curved to extend out of the page.

A substrate 230 is embedded in the polymeric material 220. The substrate 230 can be embedded to be situated along the outer periphery 222 of the polymeric material 220, away from the central region 221. The substrate 230 does not interfere with vision because it is too close to the eye to be in focus and is positioned away from the central region 221 where incident light is transmitted to the eye-sensing portions of the eye. Moreover, the substrate 230 can be formed of a transparent material to further mitigate effects on visual perception.

The substrate 230 can be shaped as a flat, circular ring (e.g., a disk with a centered hole). The flat surface of the substrate 230 (e.g., along the radial width) is a platform for mounting electronics such as chips (e.g., via flip-chip mounting) and for patterning conductive materials (e.g., via microfabrication techniques such as photolithography, deposition, plating, etc.) to form electrodes, antenna(e), and/or interconnections. The substrate 230 and the polymeric material 220 can be approximately cylindrically symmetric about a common central axis. The substrate 230 can have, for example, a diameter of about 10 millimeters, a radial width of about 1 millimeter (e.g., an outer radius 1 millimeter greater than an inner radius), and a thickness of about 50 micrometers. However, these dimensions are provided for example purposes only, and in no way limit the present disclosure. The substrate 230 can be implemented in a variety of different form factors, similar to the discussion of the substrate 130 in connection with FIG. 1 above.

A loop antenna 270, controller 250, and sensor electronics 260 are disposed on the embedded substrate 230. The controller 250 can be a chip including logic elements configured to operate the sensor electronics 260 and the loop antenna 270. The controller 250 is electrically connected to the loop antenna 270 by interconnects 257 also situated on the substrate 230. Similarly, the controller 250 is electrically connected to the sensor electronics 260 by an interconnect 251. The interconnects 251, 257, the loop antenna 270, and any conductive electrodes (e.g., for an electrochemical analyte sensor, etc.) can be formed from conductive materials patterned on the substrate 230 by a process for precisely patterning such materials, such as deposition, photolithography, etc. The conductive materials patterned on the substrate 230 can be, for example, gold, platinum, palladium, titanium, carbon, aluminum, copper, silver, silver-chloride, conductors formed from noble materials, other metals, combinations of these, etc.

The loop antenna 270 is a layer of conductive material patterned along the flat surface of the substrate to form a flat conductive ring. In some examples, to allow additional flexibility along the curvature of the polymeric material, the loop antenna 270 can include multiple substantially concentric sections electrically joined together in parallel or in series. Each section can then flex independently along the concave/convex curvature of the eye-mountable device 210. In some examples, the loop antenna 270 can be formed without making a complete loop. For instances, the antenna 270 can have a cutout to allow room for the controller 250 and sensor electronics 260, as illustrated in FIG. 2A. However, the loop antenna 270 can also be arranged as a continuous strip of conductive material that wraps entirely around the flat surface of the substrate 230 one or more times. For example, a strip of conductive material with multiple windings can be patterned on the side of the substrate 230 opposite the controller 250 and sensor electronics 260. Interconnects between the ends of such a wound antenna (e.g., the antenna leads) can then be passed through the substrate 230 to the controller 250.

When the eye-mountable device 210 is mounted over a corneal surface of an eye, the motion of the eyelids distributes a tear film that coats both the concave and convex surfaces 224, 226. The tear film is an aqueous solution secreted by the lacrimal gland to protect and lubricate the eye. The tear film layers coating the eye-mountable device 210 can be about 10 micrometers in thickness and together account for about 10 microliters. The eye-mountable device 210 may allow for electrodes to be exposed to the tear film via a channel in the polymeric material, or perhaps the polymeric material may be configured to allow for diffusion of tear film analytes to such sensor electrodes. For example, the sensor electronics 260 may include one or more sensor electrodes of an amperometric analyte sensor, and a channel in the outward-facing convex surface 224 may expose the sensor electrodes to a layer of tear fluid coating the convex surface 224. The sensor electronics can then obtain an indication of an analyte concentration in the tear film by applying a voltage to the sensor electrodes and measuring a current through one or both of the sensor electrodes. A suitable reagent can be fixed in the vicinity of the sensor electrodes to facilitate an electrochemical reaction with a desired analyte. As the analyte is consumed by such electrochemical reactions, additional analyte diffuses to the sensor, and the rate of re-supply (i.e., the rate at which the analyte diffuses to the sensor) is related to the analyte concentration. The measured amperometric current, which is related to the electrochemical reaction rate, is therefore indicative of the analyte concentration in the tear film.

III. Example Ambient Light Referenced Frequency Generation Systems

Figure 3:
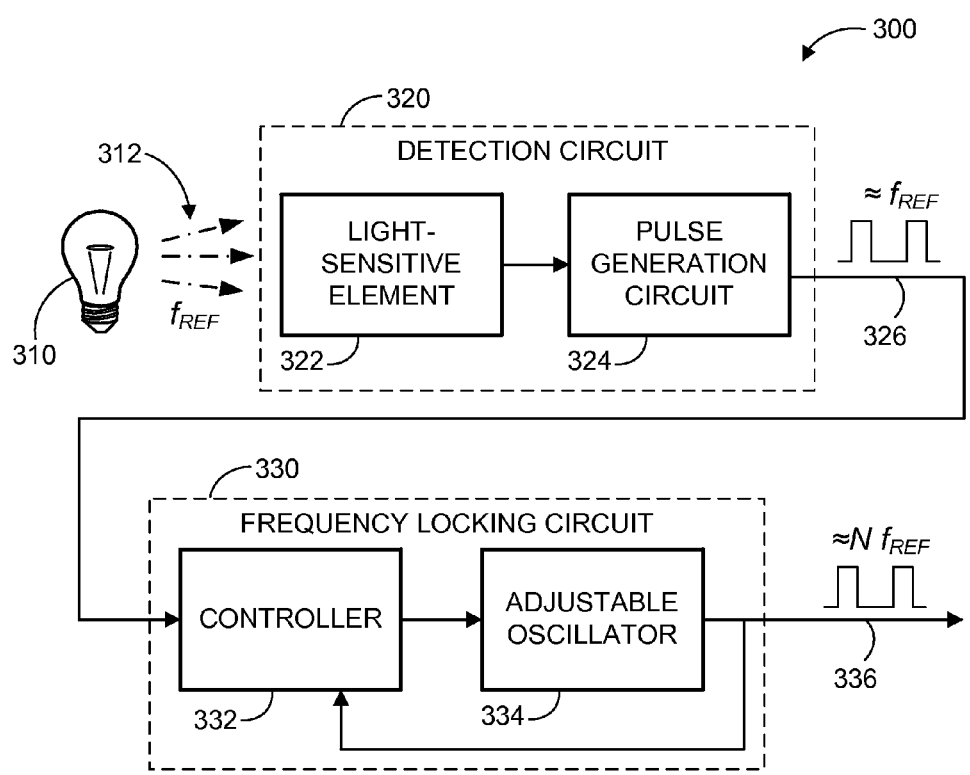
FIG. 3 is a functional block diagram of an example system configured to provide a reference frequency based on incident light.

FIG. 3 is a functional block diagram of an example system 300 configured to tune an oscillator frequency based on intensity modulated incident light. The system 300 includes a detection circuit 320 and a frequency locking circuit 330. An artificial light source 310 illuminates the detection circuit 320 with light 312. The illuminating light 312 is intensity modulated at a reference frequency $f_{REF}$ that is based on the mains frequency of the electricity source that powers the artificial light source 310. For incandescent and fluorescent light sources, the luminosity is related to the magnitude of the applied voltage, and so the frequency of the intensity modulations is twice the AC mains frequency. Although in some examples, the intensity modulated light may have a frequency equal to the AC mains frequency. For example, an artificial light source may include a polaritiy-dependent light emitting device, such as a light emitting diode (LED) that emits light when a positive polarity voltage is applied across the LED, but not when the reverse polarity is applied. Other examples may also be provided in which the light 312 is intensity modulated at the AC mains frequency or twice the AC mains frequency. For purposes herein, the frequency of the intensity modulations in the light 312 will be referred to herein as the reference frequency $f_{REF}$.

The detection circuit 320 includes a light-sensitive element 322 that responds to the intensity modulated light 312, and a pulse generation circuit 324 that generates an output signal 326 based on an input from the light-sensitive element 322. The light-sensitive element 322 may be a photodiode that generates a photocurrent proportionate to the intensity of incident light. The pulse generation circuit 324 receives an output from the light-sensitive element 322 and generates a series of pulses having the reference frequency $f_{REF}$. The series of pulses from the detection circuit 320 can then be provided to the frequency locking circuit 330 to use in tuning the oscillator frequency.

The frequency locking circuit 330 includes a controller 332 and an adjustable oscillator 334. The adjustable oscillator 334 generates an output signal 336 with a periodically varying waveform, such as a series of pulses. The frequency of the periodically varying output signal 336 can be adjusted based on an input from the controller 332. For example, the adjustable oscillator 334 may include a voltage controlled oscillator and the input may be a voltage supplied via the controller 332 (e.g., using a digital to analog converter). Changing the input voltage input to the voltage controlled oscillator can thereby adjust the frequency of the output signal 336. The controller 332 receives the signal 326 from the detection circuit 320 (e.g., a series of pulses with frequency $f_{REF}$ based on the intensity modulation of incident light). In practice, the controller 332 can tune the input to the adjustable oscillator 334 so as to cause the output 336 to have a frequency that is a multiple of the frequency of the intensity modulations ($f_{REF}$).

To lock the frequency of the adjustable oscillator 334 to a target multiple of $f_{REF}$ (i.e., a frequency N $f_{REF}$) the controller 332 may use the output signal 336 as feedback. The controller 332 can compare the signal 326 indicative of the reference frequency $f_{REF}$ and the output signal 336 and generate the input based in part on the comparison. For example, the controller 332 may include a counter or a similar device that counts the pulses in the output signal 336 between one or more successive pulses in the signal 326. The controller 332 may then compare the counted number of pulses to the target multiple and determine how to adjust the input to the adjustable oscillator 334 based in part on the comparison.

The controller 332 may be implemented using a combination of hardware-implemented, software-implemented, and/or firmware-implemented functional modules that coordinate to provide the functionality described herein. In some cases, the controller 332 may include a data storage, which may be a non-transitory computer readable medium on which data can be stored for later retrieval. The data storage may store executable instructions that can be executed by a processing system so as to perform functions specified therein, for example. In some examples, the data storage may also be used to store data indicative of particular control inputs to provide to the adjustable oscillator 334 that cause the system 300 to operate at a target multiple of the reference frequency. In such examples, the controller 332 may use the stored indication to subsequently generate the input to the adjustable oscillator 334, such as in circumstances in which the system 300 is not illuminated by artificial light, and the detector circuit 320 does not provide the input 326 indicative of the reference frequency $f_{REF}$. The stored indication may be based on a most-recently undergone tuning of the adjustable oscillator 334 in accordance with the light-based reference frequency $f_{REF}$. In addition, the data storage may also store data indicative of a relationship between different control inputs and other measured parameters that influence the adjustable oscillator 334, such as temperature, for example. The controller 332 can then retrieve such data from the data storage during a subsequent interval in which intensity modulated light is not available, and generate the control input based in part on the retrieved data.

Figure 4:
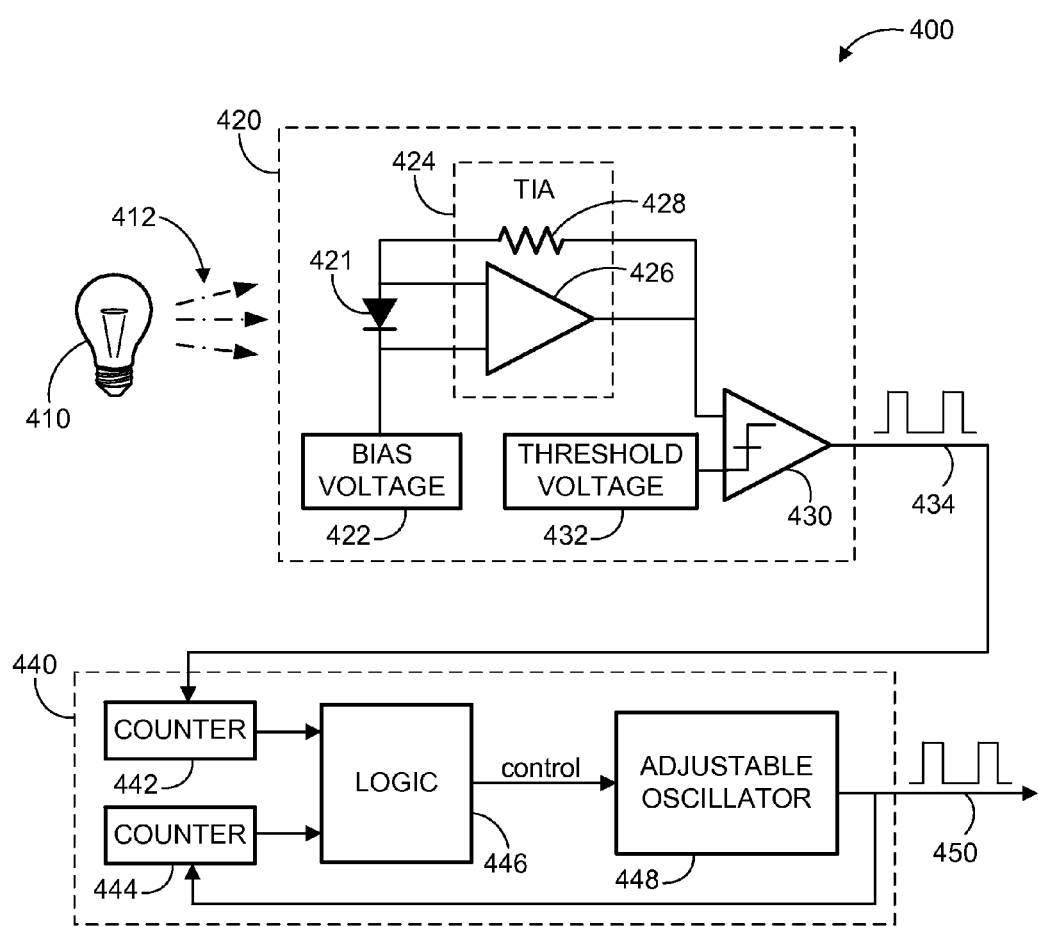
FIG. 4 is a functional block diagram of an example system configured to provide a reference frequency based on incident light.

FIG. 4 is a functional block diagram of an example system 400 configured to provide a reference frequency based on incident light. The system 400 is similar in some respects to the system 300 described in connection with FIG. 3 and may be considered an example implementation of the system 300. The system 400 includes a detection circuit 420 and a frequency locking circuit 440. An artificial light source 410 illuminates the detection circuit 420 with light 412 that is intensity modulated at a reference frequency $f_{REF}$.

The detection circuit 420 includes a photodiode 421, a transimpedance amplifier 424, and a comparator 430. While the photodiode 421 is reverse biased, the photodiode 421 generates a photocurrent proportionate to the intensity of incident light. The incident light creates electron-hole pairs in the light-sensitive depletion region of the photodiode 421, and the reverse bias causes the created electrons and holes to diffuse in opposite directions to thereby generate an internal photocurrent directed from the cathode to the anode. The photodiode 421 is reverse biased by a bias voltage source 422, which applies a voltage to the cathode greater than the voltage of the anode.

The transimpedance amplifier (TIA) 424 functions to convert the current response of the photodiode 421 to a voltage signal. The TIA 424 includes an amplifier connected across the photodiode 421 to provide a low impedance input for the photocurrent. A feedback resistor 428 is arranged between the anode of the photodiode 421 and the output of the amplifier 426 and defines the gain of the amplifier 426. The amplifier 426 can generate a voltage output proportionate to the current through the photodiode 421. When the photodiode 421 is illuminated by the intensity modulated light 412, the voltage output from the TIA 424 is a voltage signal that varies periodically at the frequency of the intensity modulation (e.g., the reference frequency $f_{REF}$).

The voltage signal from the TIA 424 can be used to create a series of pulses having a frequency based on the reference frequency $f_{REF}$ (i.e., the frequency of the intensity modulations detected with the photodiode 421). To cause the series of pulses to have the same frequency as the intensity modulations, each pulse can be generated in response to a periodically repeated feature in the voltage signal from the TIA 424. As shown in FIG. 4, the pulses may be generated using a comparator 430 that compares the voltage signal of the TIA 424 with a threshold voltage 432. Upon the input voltage (from the TIA 424) exceeding the threshold voltage 432, the comparator 430 output goes high to initiate a pulse. And upon the input voltage returning to below the threshold voltage 432, the comparator output returns to low to halt the pulse. The threshold voltage 430 is therefore selected to be between the maximum voltage and minimum voltage of the periodically varying voltage signal from the TIA 430. In some examples, the threshold voltage 432 may be adjustable using a digital-to-analog converter or another adjustable voltage source to allow for accommodating different voltage ranges of the input voltage to the comparator 430. The voltage from the TIA 424 varies based on the ambient light intensity, and based on other factors. Adjustments to the threshold voltage source 432 may therefore set the threshold voltage input to the comparator 430 to be between the maximum and minimum voltages of the periodically varying input voltage. By using an appropriate value for the threshold voltage 432, each maximum of the intensity modulated light 412 can correspond to a pulse in the output signal 434 from the detection circuit 420. For example, the threshold voltage 432 may be set based on an average voltage of the periodically varying voltage signal.

In addition, the net difference between maximum and minimum voltages from the TIA 424 (e.g., corresponding to the magnitude of the intensity variations) may depend on various factors, such as the type of artificial light source 410. For example, the instantaneous luminosity of an incandescent light source depends on the temperature of the light-emitting filament that is heated by the applied AC voltage from the mains line, and so the light intensity varies periodically based on the periodic variation in the applied AC voltage. In a fluorescent lighting system, the fluorescent emission from the reaction tube is dependent on accelerating electrons from an electrode to react with gas substances in the tube. The electrons are accelerated in response to the applied AC voltage, and so the emission rate varies periodically based on the periodic variation in the applied AC voltage. In either case, the instantaneous intensity of the emitted light is correlated to some extent with the instantaneous magnitude voltage of the AC waveform. However, the luminosity does not completely turn off as the AC voltage passes through zero due to the capacitance in the light source 410. For example, in an incandescent light source, the heat capacity of the light-emitting filament causes the filament to continue emitting light as the AC voltage crosses zero. Depending on the heat capacity, the emitted light may dim and brighten by different relative amounts throughout the cycle of the applied AC voltage, and the relative difference in the voltage signal from the TIA 424 (e.g., the amplitude of the modulation) can also vary.

The frequency locking circuit 440 includes a first counter 442 and a second counter 444 that provide inputs to a hardware logic module 446, and an adjustable oscillator 448. Based in part on the inputs from the counters 442, 444, the logic module 446 generates a control signal that is provided to the adjustable oscillator 448. The counter 442 receives the signal 434 from the comparator 430 (e.g., a series of pulses at a reference frequency $f_{REF}$). The counter 442 increments a value for each pulse received from the output signal 434, and provides an indication of the incremented value to the logic module 446. Similarly, the counter 444 increments a value for each pulse received from the oscillator output signal 450. The counter 444 can also provide an indication of the current count of oscillator pulses, and may also be reset to restart the count at zero. For example, the counter 444 may be reset each time the counter 442 is incremented, and the number of oscillator pulses between successive pulses of the signal 434 can be indicated to the logic module 446 by the counter 444.

To achieve an output frequency that is a target multiple of the reference frequency, the adjustable oscillator 448 is modified using the control signal such that the number of oscillator pulses counted between successive pulses at $f_{REF}$ (as indicated by the signal 434 and counter 442. If the number counted by the counter 444 is less than the target multiple, then the logic module 446 can tune the control signal to increase the frequency of the adjustable oscillator 448. And if the number counted by the counter 444 is greater than the target multiple, then the logic module 446 can tune the control signal to decrease the frequency of the adjustable oscillator 448.

In addition, the logic module 446 may integrate counts accumulated by the counter 444 over multiple pulses at the reference frequency $f_{REF}$, as indicated by the counter 442, and tune the adjustable oscillator 448 based on a comparison between the integrated count (net count) reported by the counter 444 and a corresponding multiple of the target multiple. By integrating over multiple pulses of the reference frequency signal 434 output by the detection circuit 420, the frequency locking circuit 440 may be less susceptible to phase noise (e.g., timing jitter) in the signal 434. For example, the output signal 434 may exhibit phase noise due to corresponding phase noise in the intensity modulations of the received light 412 (e.g., due to underlying timing jitter in the AC voltage). In addition, the pulse generation components may create pulses with some additional phase noise due to imprecision in firing the comparator 430 at precisely the same phase of the underlying voltage waveform from the TIA 424. By integrating the counter 444 over multiple cycles of the output signal 434, the effect of phase noise from such effects is at least partially mitigated by canceling out opposing timing jitter on different pulses of the signal 434.

The system 400 includes one example of a light detection circuit 420 and a frequency locking circuit 440 that function together to generate the oscillator output signal 450 at a target frequency based on the reference frequency indicated by the intensity modulated light 412 (e.g., a multiple of the reference frequency). Alternative arrangements of the light detection circuit and/or frequency locking loop can also be used to achieve a similar result. Some additional examples of such alternative circuits are described below in connection with FIGS. 5A-6B. To facilitate comparisons between the different circuits, like components between the circuits 420, 440 described in connection with FIG. 4 are labeled with common element numbers in the following figures, though it is to be understood that each disclosed circuit may represent distinct embodiments. Further, some aspects of the separate circuits may be combined in various ways.

3a) Example Light Detection Circuits

Figure 5A:
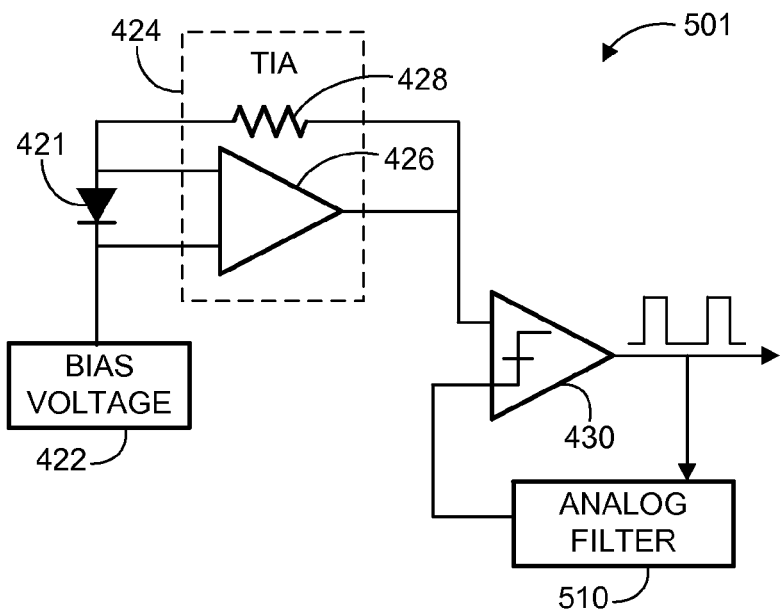
FIG. 5A is a functional block diagram of an example light detection circuit for generating a series of pulses with a frequency based on incident light.

FIG. 5A is a functional block diagram of an example light detection circuit 501 that is configured to generate a series of pulses with a frequency based on incident light Like the light detection circuit 420 discussed in connection with FIG. 4, the circuit 501 includes photodiode 421 biased by bias voltage 422 to operate in photoconductive mode, and TIA 424 transforms the photocurrent generated by the photodiode 421 to a voltage signal that is provided to one input of comparator 430. However, rather than comparing the output voltage signal from the TIA 424 to a threshold voltage source, an analog filter 510 is coupled to the other input of the comparator 430.

The analog filter 510 generates an input voltage to the comparator 430 for use in generating the series of pulses. The voltage provided to the comparator 430 may therefore be referred to as a comparison voltage. The comparison voltage may be, for example, a DC bias of the varying voltage signal output from the TIA 424 and/or an average voltage of such varying voltage. In another example, the comparison voltage is between the maximum and minimum voltages in the output from the TIA 424, and may be adjusted over time based on the series of pulses output by the comparator 430. Similar to the description above, the comparator 430 outputs a pulse for each occurrence of the varying voltage signal from the TIA 424 crossing (i.e., exceeding) the comparison voltage (e.g., the voltage supplied by the analog filter 510). The analog filter 510 receives as input the series of pulses output from the comparator 430, and therefore adjusts the comparison voltage based on the series of pulses. While not specifically shown in FIG. 5A, the analog filter 510 may additionally or alternatively receive an input from the varying voltage output by the TIA 424, and use that varying voltage to extract a DC bias (e.g., by low pass filtering).

Figure 5B:
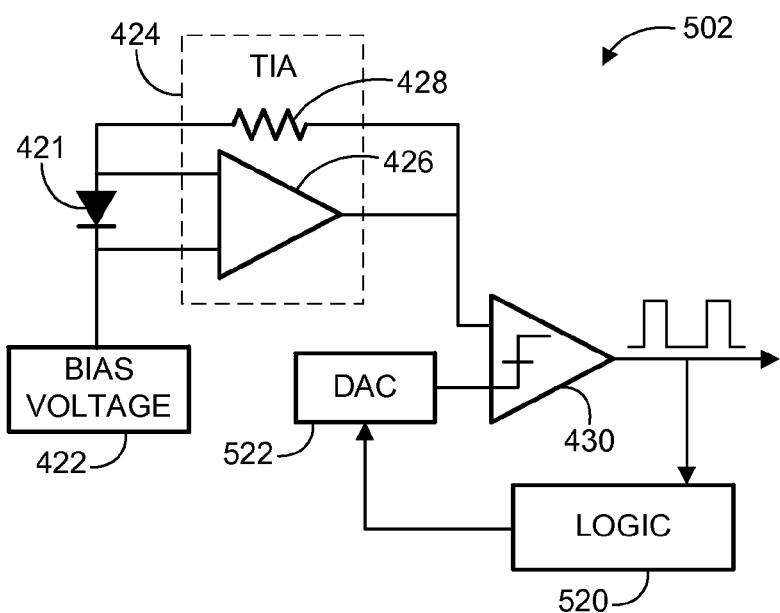
FIG. 5B is a functional block diagram of an example light detection circuit for generating a series of pulses with a frequency based on incident light.

FIG. 5B is a functional block diagram of another example light detection circuit 502 for generating a series of pulses with a frequency based on incident light. Like the light detection circuit 420 discussed in connection with FIG. 4, the circuit 502 includes the photodiode 421 biased by bias voltage 422 to operate in photoconductive mode. And the TIA 424 transforms the photocurrent generated by the photodiode 421 to a voltage signal that is provided to one input of the comparator 430. However, rather than comparing the output voltage signal from the TIA 424 to a threshold voltage source, a digital-to-analog converter 522 is coupled to the other input of the comparator 430. The digital-to-analog converter 522 provides a comparison voltage to the comparator based on instructions from a logic module 520.

The logic module 520 receives as input the series of pulses output from the comparator 430, and therefore adjusts the comparison voltage (via the digital-to-analog converter 522) based on the series of pulses output from the comparator 430.

The logic module 520 may include, for example, a voltage sensor that monitors the series of pulses. If such measurements indicate a degradation in the series of pulses (e.g., noise) the logic module 520 may then generate instructions to the digital-to-analog converter 522 to either increase or decrease the comparison voltage to improve the monitored characteristics of the series of pulses. While not specifically shown in FIG. 5B, the logic module 520 may additionally or alternatively receive an input from the varying voltage output by the TIA 424, use a measurement of the varying voltage to extract a DC bias, and instruct the digital-to-analog converter 522 to provide a comparison voltage based on the extracted DC bias.

3b) Example Frequency Locking Circuits

Figure 6A:
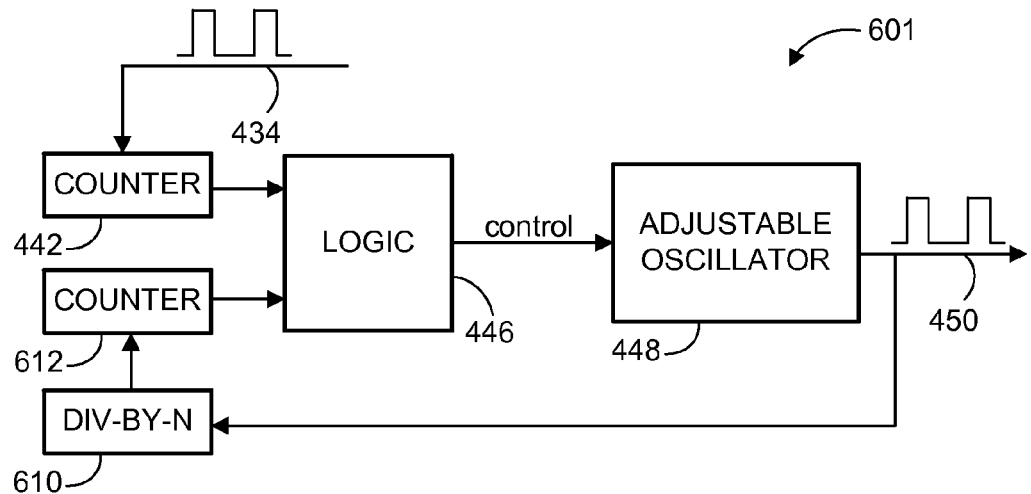
FIG. 6A is a functional block diagram of an example frequency locking circuit.

FIG. 6A is a functional block diagram of an example frequency locking circuit 601. Like the frequency locking circuit 440 discussed in connection with FIG. 4, the circuit 601 includes counters 442, a hardware logic module 446, and an adjustable oscillator 448. The counter 442 receives a signal 434 from a light detection circuit that includes an indication of the reference frequency, such as a series of pulses repeated at the reference frequency. The counter 442 increments a value upon receipt of each periodic pulse (or other periodically repeated feature in the signal 434). And the counter 442 provides an indication of the number of pulses to the logic module 446. The logic module 446 can then tune the control signal that adjusts the frequency of the adjustable oscillator 448 based in part on the values provided by the counter 442 in order to tune the adjustable oscillator 448 to a target multiple of the reference frequency. However, rather than comparing the number of counts of the oscillator frequency between successive pulses at the reference frequency, as in FIG. 4, the logic module 446 receives an input from a counter 612 that is receiving the output of a divide-by-N module 610.

The divide-by-N module 610 receives the output signal 450 of the adjustable oscillator 448 and outputs a corresponding pulse that fires once for each N pulses of the oscillator output signal 450. Thus, the divide-by-N module 610 translates the periodic output signal 450 of the adjustable oscillator from the current oscillator frequency ($f_{OSC}$) to a periodic signal with a frequency $f_{OSC}/N$. If N is the target multiple of the reference frequency $f_{REF}$, then the logic module 446 functions to tune the adjustable oscillator frequency (via the control signal) such that the two counters 442, 612 are incremented at substantially the same rate. If the counters 442, 612 are incremented at the same rate, then the adjustable oscillator 448 has a frequency of $f_{OSC}$=N $f_{REF}$. (i.e., the target multiple of the reference frequency). And if the divide-by-N module 610 divides by a number other than the target multiple of $f_{REF}$, then the logic module 446 may function to cause the two counters 442, 612 to increment at a target rate with respect to one another that causes $f_{OSC}$≈N $f_{REF}$.

Figure 6B:
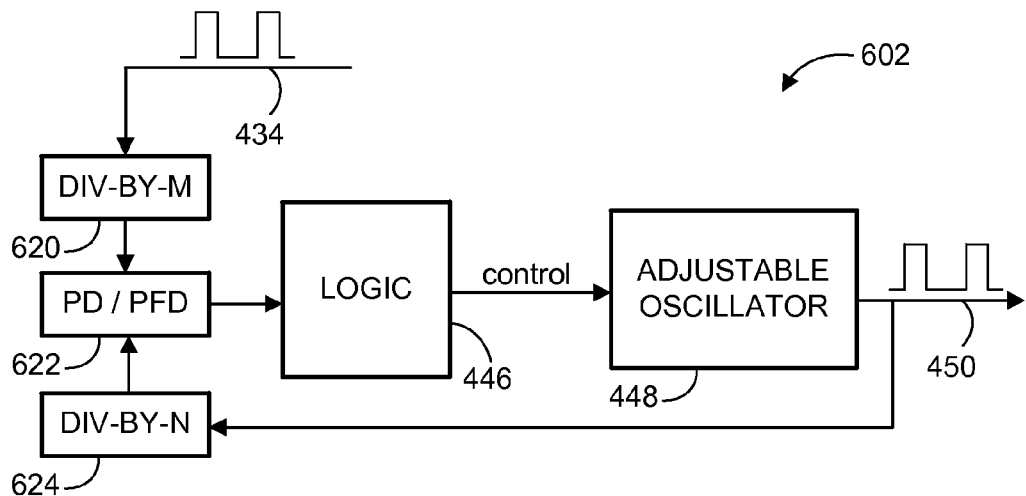
FIG. 6B is a functional block diagram of an example frequency locking circuit.

FIG. 6B is a functional block diagram of another example frequency locking circuit 602. Like the frequency locking circuit 440 discussed in connection with FIG. 4, the circuit 602 includes a hardware logic module 446 and an adjustable oscillator 448. The logic module 446 receives an input from a phase detector 622 and/or a phase-frequency detector. The phase detector 622 compares the phases of two input signals, and indicates the relative phase difference to the logic module 446, which the logic module 446 uses to tune the adjustable oscillator 448.

One of the inputs to the phase detector 622 is based on the output 434 from a light detection circuit that includes an indication of the reference frequency, such as a series of pulses repeated at the reference frequency. As shown in FIG. 6B, the output signal 434 may be provided to a divide-by-M module 620 which translates the frequency of the signal 434 from $f_{REF}$ to $f_{REF}/M$. Alternatively, the divide-by-M module 620 may be omitted, and the phase detector 622 may instead receive the output signal 434.

The other input to the phase detector 622 is based on the oscillator output 450, and is therefore indicative of the present oscillator frequency $f_{OSC}$. As shown in FIG. 6B, the oscillator signal 434 may be provided to a divide-by-N module 624 which translates the frequency of the signal 434 from $f_{OSC}$ to $f_{OSC}/N$.

The logic module 446 can be used to minimize the phase difference indicated by the phase detector 622 (e.g., by phase locking the periodic variations in the two signals 434, 450) and thereby cause the oscillator frequency $f_{OSC}$ of the oscillator output 450 of adjustable oscillator 448 to approach a target multiple of the output signal 434 indicative of the reference frequency $f_{REF}$. The target multiple of $f_{REF}$ may be based on the divide-by-N module 624, the divide-by-M module 620, or both.

IV. Example Operations

Figure 7:
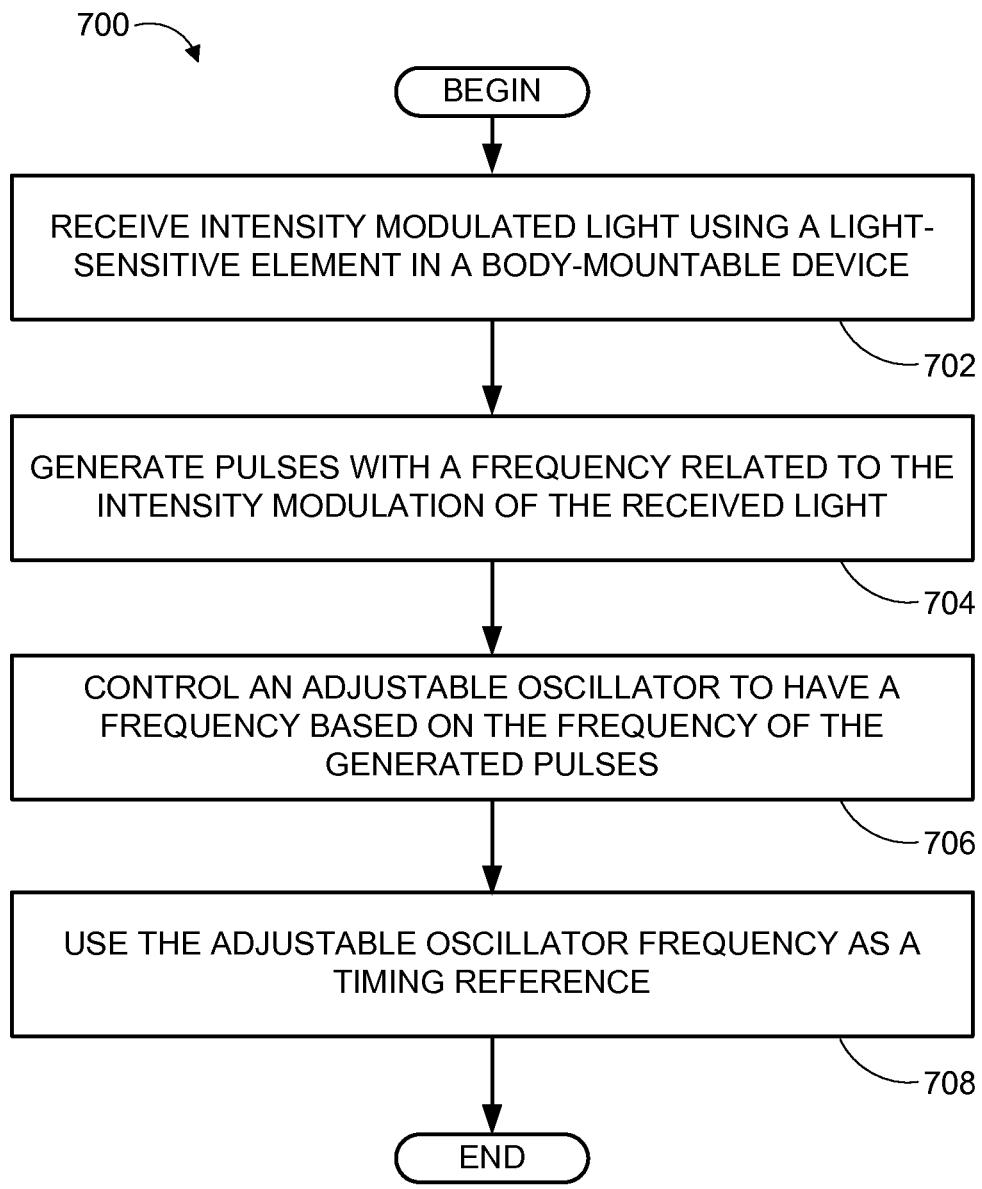
FIG. 7 is a flowchart of an example process for providing a reference frequency based on a frequency of intensity modulation in incident light.

FIG. 7 is a flowchart of an example process 700 for providing a reference frequency based on a frequency of intensity modulation in incident light. The process 700 may be performed by any of the body-mountable devices described above that include a light-referenced oscillator. Although it is noted that referencing an oscillator to a frequency of intensity modulations in artificial light may be used in a variety of different applications.

At block 702, intensity modulated light is received using a light-sensitive element in a body-mountable device. For example, the light may be received using a photodiode that generates a photocurrent in proportion to the intensity of incident light. The output from the photodiode varies periodically at a reference frequency that is related to the AC mains frequency. Example light detection circuits described in connection with FIGS. 3-5 include examples of such light-sensitive circuits.

At block 704, a periodic signal, such as a series of pulses, is generated with a frequency related to the intensity modulation of the received light. For example, as described in connection with FIG. 4, a series of pulses may be generated using a comparator that compares a varying voltage based on an output from the light sensitive element with a threshold voltage (e.g., the comparison voltage described above). The comparator then outputs a pulse for each occurrence of the varying voltage exceeding the threshold. In some examples, the functions of blocks 702, 704 may be performed using any of the light detection circuits described above.

At block 706, a control signal is generated to tune an adjustable oscillator frequency based on the frequency of the series of pulses. The control signal may be generated based on a comparison between a number of oscillations (e.g., pulses) output from the adjustable oscillator between successive pulses related to the intensity modulated light, which occur at the reference frequency. The counted number of oscillations can be compared with a target number that corresponds to a target multiple of the reference frequency. A controller, such as the logic module described herein, may then generate the control signal provided to the adjustable oscillator to increase or decrease the oscillator frequency such that the oscillator frequency approaches the target multiple of the reference frequency over time (and the number of oscillations counted between successive pulses at the reference frequency approaches the target number).

At block 708, the adjustable oscillator frequency is used as a timing reference by components in the body-mountable device. The calibrated oscillator may be used as a timing reference for a variety of purposes. In one example, the circuitry components within an integrated circuit may be calibrated and/or compensated to account for process variations in such components by using the timing reference. In one example, a precision voltage (e.g., a silicon bandgap voltage) may be applied to a component, and then a measurement can be made following a duration referenced using the calibrated oscillator as a timing reference. The amount of discharge during the known interval can then be used to determine the electrical properties of the component (e.g., the capacitance, resistance, etc.). As individual components become characterized in that manner, additional components can be measured and calibrated until the electrical properties of the integrated circuit are well characterized.

In addition, some examples may include storing an indication of the generated control signal used to achieve the target multiple of the reference frequency (e.g., the most recently generated control signal). For example, an indication of the control signal may be stored in a non-transient data storage. Subsequently, the controller that tunes the adjustable oscillator can retrieve the stored indication and generate the control signal based on the stored data. In some examples, the stored indication may be used in instances when the device is not illuminated by an artificial light source that is intensity modulated at a frequency based on the AC mains frequency. Such controller may therefore first determine that the device is not being illuminated by intensity modulated light indicative of the reference frequency, and that determination may be made based on an output from the light detection circuits described herein. For example, if the frequency detection circuit is unable to output a periodic series of pulses for a variety of reasons, the frequency locking circuit may retrieve a stored indication from data storage and generate a control signal to tune the oscillator based on the retrieved data.

Moreover, it is particularly noted that while the electronics platform is described herein by way of example as an eye-mountable device or an ophthalmic device, it is noted that the disclosed systems and techniques for small form factor imaging systems can be applied in other contexts as well. For example, contexts in which electronics platforms are operated with low power budgets (e.g., via harvested energy from radiated sources) or are constrained to small form factors (e.g., implantable bio-sensors or other wearable electronics platforms) may employ the systems and processes described herein to reference an oscillator to a reference frequency indicated by intensity modulations in received light. In one example, an implantable medical device that includes a light sensor and an adjustable oscillator may be encapsulated in biocompatible material and implanted within a host organism. The implantable medical device may include a circuit configured to detect light received by a photo-sensitive element, extract a reference frequency based on intensity modulations in the received light, and tune an oscillator frequency based on the reference frequency to thereby calibrate the oscillator. The configurations disclosed herein allow for calibrating an oscillator frequency based on incident light. The calibrated oscillator can then be used as a timing reference for calibration and/or compensation of process variations, for example. The present disclosure thereby allows for inclusion of a timing reference in a spatially constrained application in which another precision oscillator (e.g., a quartz oscillator) is unsuitable.

Figure 8:
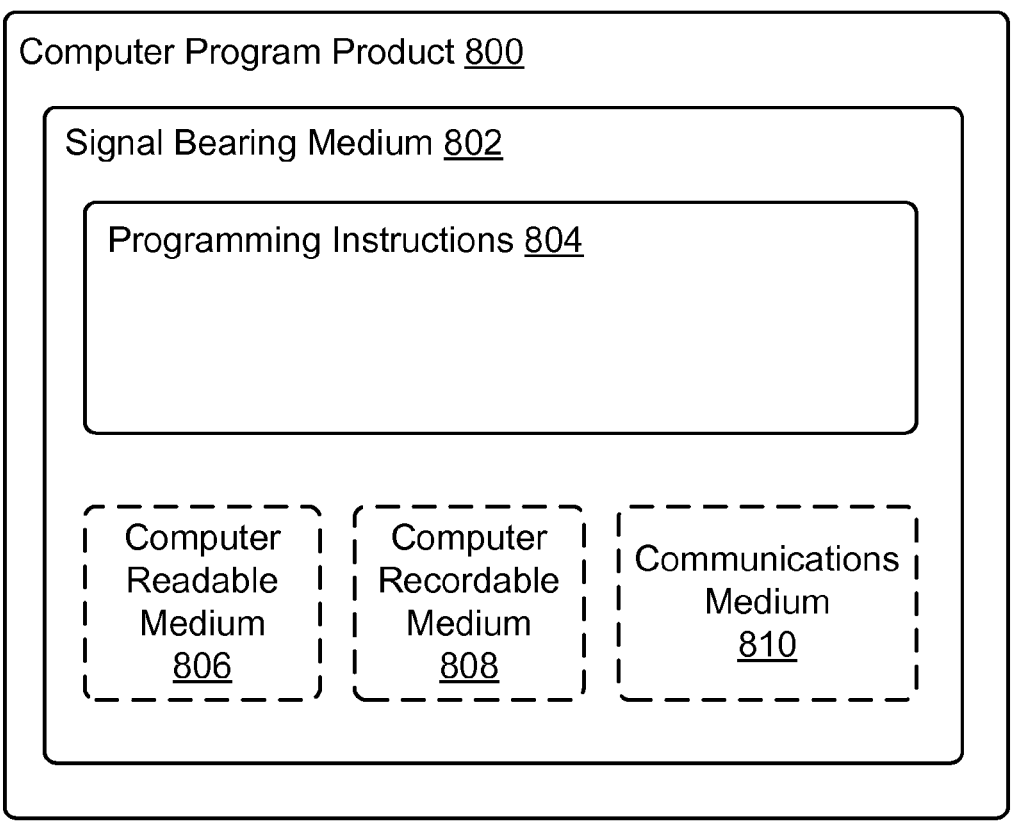
FIG. 8 depicts a computer-readable medium configured according to an example embodiment.

FIG. 8 depicts a computer-readable medium configured according to an example embodiment. In example embodiments, the example system can include one or more processors, one or more forms of memory, one or more input devices/interfaces, one or more output devices/interfaces, and machine-readable instructions that when executed by the one or more processors cause the system to carry out the various functions, tasks, capabilities, etc., described above.

As noted above, in some embodiments, the disclosed techniques can be implemented by computer program instructions encoded on a non-transitory computer-readable storage media in a machine-readable format, or on other non-transitory media or articles of manufacture (e.g., the instructions 184 stored on the memory storage 182 of the external reader 180 of the system 100). FIG. 8 is a schematic illustrating a conceptual partial view of an example computer program product 800 that includes a computer program for executing a computer process on a computing device, arranged according to at least some embodiments presented herein.

In one embodiment, the example computer program product 800 is provided using a signal bearing medium 802. The signal bearing medium 802 may include one or more programming instructions 804 that, when executed by one or more processors may provide functionality or portions of the functionality described above with respect to FIGS. 1-7. In some examples, the signal bearing medium 802 can be a non-transitory computer-readable medium 806, such as, but not limited to, a hard disk drive, a Compact Disc (CD), a Digital Video Disk (DVD), a digital tape, memory, etc. In some implementations, the signal bearing medium 802 can be a computer recordable medium 808, such as, but not limited to, memory, read/write (R/W) CDs, R/W DVDs, etc. In some implementations, the signal bearing medium 802 can be a communications medium 810, such as, but not limited to, a digital and/or an analog communication medium (e.g., a fiber optic cable, a waveguide, a wired communications link, a wireless communication link, etc.). Thus, for example, the signal bearing medium 802 can be conveyed by a wireless form of the communications medium 810.

The one or more programming instructions 804 can be, for example, computer executable and/or logic implemented instructions. In some examples, a computing device such as the processor-equipped external reader 180 of FIG. 1 is configured to provide various operations, functions, or actions in response to the programming instructions 804 conveyed to the computing device by one or more of the computer readable medium 806, the computer recordable medium 808, and/or the communications medium 810.

The non-transitory computer readable medium 806 can also be distributed among multiple data storage elements, which could be remotely located from each other. The computing device that executes some or all of the stored instructions could be an external reader, such as the reader 180 illustrated in FIG. 1, or another mobile computing platform, such as a smartphone, tablet device, personal computer, etc. Alternatively, the computing device that executes some or all of the stored instructions could be remotely located computer system, such as a server.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:
1. A system comprising:
an adjustable oscillator configured to generate a periodically varying output signal at an oscillator frequency, wherein the oscillator frequency is at least partially based on an input control signal;

a light-sensitive element configured to generate an output signal indicative of an intensity of light incident on the light-sensitive element;

a controller configured to: (i) receive a first input signal based on the output signal from the light-sensitive element, wherein the first input signal has a frequency based on a reference frequency at which an intensity of light incident on the light-sensitive element periodically varies; (ii) generate a control signal based in part on the reference frequency; and (iii) provide the generated control signal to the adjustable oscillator to thereby adjust the oscillator frequency; and a pulse generation circuit configured to generate the first input signal received by the controller, wherein the pulse generation circuit comprises a comparator configured to: (i) receive a voltage signal based on the output signal from the light-sensitive element; and (ii) output a series of voltage pulses, wherein each voltage pulse corresponds to the received voltage signal exceeding a threshold voltage.

2. The system of claim 1, wherein the controller is further configured to determine a target multiple of the reference frequency, and wherein the generated control signal is configured to cause the oscillator frequency to become closer to the target multiple of the reference frequency.

3. The system of claim 2, wherein the controller is further configured to iteratively update the control signal such that the oscillator frequency approaches the target multiple of the reference frequency over time.

4. The system of claim 2, further comprising:
a non-transitory data storage; and
wherein the controller is further configured to: (i) while the light-sensitive element receives a periodically varying light intensity indicative of the reference frequency, determine a particular control signal based on the target multiple of the reference frequency; (ii) store an indication of the particular control signal in the non-transitory data storage; and (iii) while the light-sensitive element does not receive a periodically varying light intensity indicative of the reference frequency, use the stored indication to generate the control signal.

5. The system of claim 1, wherein the controller is further configured to: (i) receive a second input signal based on an output signal from the adjustable oscillator, wherein the second input signal has a frequency based on the oscillator frequency; (ii) compare the first input signal and the second input signal; and (iii) generate the control signal based in part on the comparison between the first and second input signals.

6. The system of claim 5, further comprising:
a counter configured to: (i) count a number of cycles of the output signal of the adjustable oscillator between successive cycles of the periodically varying light intensity indicated by the first input signal, and (ii) provide an indication of the counted number of cycles to the controller; and
wherein the controller is configured to generate the control signal based in part on a comparison between the counted number of cycles and a target number of cycles.

7. The system of claim 1, wherein the adjustable oscillator comprises a voltage controlled oscillator.

8. The system of claim 1, wherein the light-sensitive element comprises a photodiode.

9. The system of claim 1, further comprising:
a polymeric material formed to include a body-mountable surface; and a substrate at least partially embedded within the polymeric material, wherein the light-sensitive element, the adjustable oscillator, and the controller are disposed on the substrate.

10. The system of claim 9, wherein the polymeric material has a concave surface and a convex surface, wherein the concave surface is configured to be removably mounted over a corneal surface and the convex surface is configured to be compatible with eyelid motion when the concave surface is so mounted.

11. The system of claim 1, further comprising:
circuit components; and
a calibration system configured to receive the output signal from the adjustable oscillator and use the oscillator frequency as a timing reference to calibrate the circuit components.

12. A method comprising:
generating, by a light-sensitive element, an output signal indicative of an intensity of light incident on the light-sensitive element;
receiving, by a pulse generation circuit comprising a comparator, a voltage signal based on the output signal from the light-sensitive element and generating a first controller-input signal comprising a series of voltage pulses, wherein each voltage pulse corresponds to the received voltage signal exceeding a threshold voltage, and wherein the first controller-input signal has a frequency based on a reference frequency at which an intensity of light incident on the light-sensitive element periodically varies;
receiving, by a controller, the first controller-input signal and generating a control signal based in part on the reference frequency; and
providing the generated control signal to an adjustable oscillator to thereby adjust an oscillator frequency thereof.

13. The method of claim 12, further comprising:
determining a target multiple of the reference frequency;
generating the control signal such that the generated control signal is configured to cause the oscillator frequency to become closer to the target multiple of the reference frequency.

14. The method of claim 13, further comprising:
iteratively updating the control signal such that the oscillator frequency approaches the target multiple of the reference frequency over time.

15. The method of claim 13, further comprising:
while the light-sensitive element receives a periodically varying light intensity indicative of the reference frequency, determining a particular control signal value based on the target multiple of the reference frequency;
storing an indication of the particular control signal in a non-transitory data storage; and
while the light-sensitive element does not receive a periodically varying light intensity indicative of the reference frequency, using the stored indication to generate the control signal.

16. The method of claim 12, further comprising:
receiving, by the controller, a second controller-input signal based on an output signal from the adjustable oscillator, wherein the second controller-input signal has a frequency based on the oscillator frequency;
comparing the first controller-input signal and the second controller-input signal; and
basing the control signal in part on the comparison between the first and second controller-input signals.

17. The method of claim 12, further comprising:
using the oscillator frequency as a timing reference to calibrate one or more circuit components.

18. A body-mountable device comprising:
a polymeric material formed to include a body-mountable surface;
a substrate at least partially embedded within the polymeric material;
an adjustable oscillator disposed on the substrate, wherein the adjustable oscillator is configured to generate a periodically varying output signal at an oscillator frequency, wherein the oscillator frequency is at least partially based on an input control signal;
a light-sensitive element disposed on the substrate, wherein the light-sensitive element is configured to generate an output signal indicative of an intensity of light incident on the light-sensitive element;
a controller disposed on the substrate, wherein the controller is configured to: (i) receive a first input signal including a signal generated based on the output signal from the light-sensitive element, wherein the first input signal has a frequency based on a reference frequency at which an intensity of light incident on the light-sensitive element periodically varies; (ii) generate a control signal based in part on the reference frequency; and (iii) provide the generated control signal to the adjustable oscillator to thereby adjust the oscillator frequency; and
a pulse generation circuit disposed on the substrate, wherein the pulse generation circuit is configured to generate the first input signal received by the controller, wherein the pulse generation circuit comprises a comparator configured to: (i) receive a voltage signal based on the output signal from the light-sensitive element; and (ii) output a series of voltage pulses, wherein each voltage pulse corresponds to the received voltage signal exceeding a threshold voltage.

19. The body-mountable device of claim 18, wherein the polymeric material has a concave surface and a convex surface, wherein the concave surface is configured to be removably mounted over a corneal surface and the convex surface is configured to be compatible with eyelid motion when the concave surface is so mounted.

* * * * *